United States Patent
Hemink

(10) Patent No.: US 7,499,326 B2
(45) Date of Patent: *Mar. 3, 2009

(54) APPARATUS FOR REDUCING THE IMPACT OF PROGRAM DISTURB

(75) Inventor: Gerrit Jan Hemink, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 245 days.

This patent is subject to a terminal disclaimer.

(21) Appl. No.: 11/413,683

(22) Filed: Apr. 28, 2006

(65) Prior Publication Data

US 2007/0242522 A1 Oct. 18, 2007

Related U.S. Application Data

(60) Provisional application No. 60/791,365, filed on Apr. 12, 2006.

(51) Int. Cl.
*G11C 16/04* (2006.01)
(52) U.S. Cl. .............................. 365/185.17; 365/185.12
(58) Field of Classification Search ............ 365/185.17, 365/185.12, 185.03, 185.24
See application file for complete search history.

(56) References Cited

U.S. PATENT DOCUMENTS

| | | | |
|---|---|---|---|
| 5,101,378 A | 3/1992 | Radjy | |
| 5,532,962 A | 7/1996 | Auclair | |
| 5,539,960 A | 7/1996 | Vanasse et al. | |
| 5,657,332 A | 8/1997 | Auclair | |
| 5,862,074 A | 1/1999 | Park | |
| 5,894,435 A | 4/1999 | Nobukata | |
| 5,943,260 A | 8/1999 | Hirakawa | |
| 6,044,019 A | 3/2000 | Cernea | |
| 6,154,157 A | 11/2000 | Wong | |
| 6,160,739 A | 12/2000 | Wong | |
| 6,175,522 B1 | 1/2001 | Fang | |
| 6,181,599 B1 | 1/2001 | Gongwer | |
| 6,222,762 B1 | 4/2001 | Guterman | |
| 6,285,593 B1 | 9/2001 | Wong | |
| 6,345,000 B1 | 2/2002 | Wong | |
| 6,456,528 B1 | 9/2002 | Chen | |

(Continued)

FOREIGN PATENT DOCUMENTS

EP 01271553 1/2003

(Continued)

OTHER PUBLICATIONS

Response to Office Action, dated Apr. 6, 2008, U.S. Appl. No. 11/414,758.

(Continued)

*Primary Examiner*—Vu A Le
(74) *Attorney, Agent, or Firm*—Vierra Magen Marcus & DeNiro LLP

(57) ABSTRACT

The unintentional programming of an unselected (or inhibited) non-volatile storage element during a program operation that intends to program another non-volatile storage element is referred to as "program disturb." A system is proposed for programming and/or reading non-volatile storage that reduces the effect of program disturb. In one embodiment, different verify levels are used for a particular word line (or other grouping of storage elements) during a programming process. In another embodiment, different compare levels are used for a particular word (or other grouping of storage elements) during a read process.

11 Claims, 13 Drawing Sheets

U.S. PATENT DOCUMENTS

| | | |
|---|---|---|
| 6,462,988 B1 | 10/2002 | Harari |
| 6,504,762 B1 | 1/2003 | Harari |
| 6,522,580 B2 | 2/2003 | Chen |
| 6,532,556 B1 | 3/2003 | Wong |
| 6,542,407 B1 | 4/2003 | Chen |
| 6,570,785 B1 | 5/2003 | Mangan |
| 6,570,790 B1 | 5/2003 | Harari |
| 6,643,188 B2 | 11/2003 | Tanaka |
| 6,717,847 B2 | 4/2004 | Chen |
| 6,717,851 B2 | 4/2004 | Mangan |
| 6,760,068 B2 | 7/2004 | Petropoulos et al. |
| 6,771,536 B2 | 8/2004 | Li |
| 6,781,877 B2 | 8/2004 | Cernea |
| 6,859,397 B2 | 2/2005 | Lutze |
| 6,888,758 B1 | 5/2005 | Hemink |
| 7,020,017 B2* | 3/2006 | Chen et al. ............. 365/185.03 |
| 7,085,165 B2 | 8/2006 | Wu |
| 7,136,304 B2* | 11/2006 | Cohen et al. ........... 365/185.19 |
| 7,259,987 B2 | 8/2007 | Chen |
| 7,307,887 B2 | 12/2007 | Chen |
| 7,352,629 B2 | 4/2008 | Chen |
| 2002/0051383 A1 | 5/2002 | Mangan |
| 2003/0112663 A1 | 6/2003 | Quader |
| 2003/0128586 A1 | 7/2003 | Chen |
| 2003/0137888 A1 | 7/2003 | Chen |
| 2003/0218920 A1 | 11/2003 | Harari |
| 2004/0012998 A1 | 1/2004 | Chien |
| 2004/0027865 A1 | 2/2004 | Mangan |
| 2004/0042270 A1 | 3/2004 | Huang |
| 2004/0047182 A1 | 3/2004 | Cernea |
| 2004/0079988 A1 | 4/2004 | Harari |
| 2004/0156241 A1 | 8/2004 | Mokhlesi |
| 2004/0179404 A1 | 9/2004 | Quader |
| 2004/0190337 A1 | 9/2004 | Chen |
| 2006/0120162 A1 | 6/2006 | Fujiu |
| 2006/0227618 A1 | 10/2006 | Lee |
| 2007/0242509 A1 | 10/2007 | Hemink |
| 2007/0242510 A1 | 10/2007 | Hemink |
| 2007/0242524 A1* | 10/2007 | Hemink ................. 365/185.28 |

FOREIGN PATENT DOCUMENTS

| | | |
|---|---|---|
| WO | 20050101424 | 10/2005 |

OTHER PUBLICATIONS

U.S. Appl. No. 11/296,055, filed Dec. 6, 2005, Erasing Non-Volatile Memory Using Individual Verification and Additional Erasing of Subsets of Memory Cells, by Hemink.

Notice of Allowance dated Jan. 14, 2008, U.S. Appl. No. 11/413,951.

Office Action dated Jan. 22, 2008, U.S. Appl. No. 11/414,758.

Notice of Allowance dated Mar. 27, 2008, U.S. Appl. No. 11/413,951, filed Apr. 28, 2006.

Notice of Allowance dated Mar. 19, 2008, U.S. Appl. No. 11/413,671, filed Apr. 28, 2006.

Notice of Allowance dated Nov. 29, 2008, U.S. Appl. No. 11/413,671, filed Apr. 28, 2006.

International Search Report, dated Nov. 10, 2007, PCT/US2007/007087.

International Search Report, dated Nov. 10, 2007, PCT/US2007/007156.

Notice of Allowance dated May 9, 2008, U.S. Appl. No. 11/413,671, filed Apr. 28, 2006.

Notice of Allowance dated May 21, 2008, U.S. Appl. No. 11/413,951, filed Apr. 28, 2006.

Notice of Allowance dated Jul. 1, 2008, U.S. Appl. No. 11/414,758, filed Apr. 28, 2006.

International Preliminary Report on Patentability, dated Oct. 14, 2008, PCT Appl. No. PCT/US2007/007087, filed Mar. 22, 2007.

Written Opinion of the International Searching Authority, dated Oct. 14, 2008, PCT Appl. No. PCT/US2007/007087, filed Mar. 22, 2007.

International Preliminary Report on Patentability, dated Oct. 14, 2008, PCT Appl. No. PCT/US2007/007156, filed Mar. 22, 2007.

Written Opinion of the International Searching Authority, dated Oct. 14, 2008, PCT Appl. No. PCT/US2007/007156, filed Mar. 22, 2007.

* cited by examiner

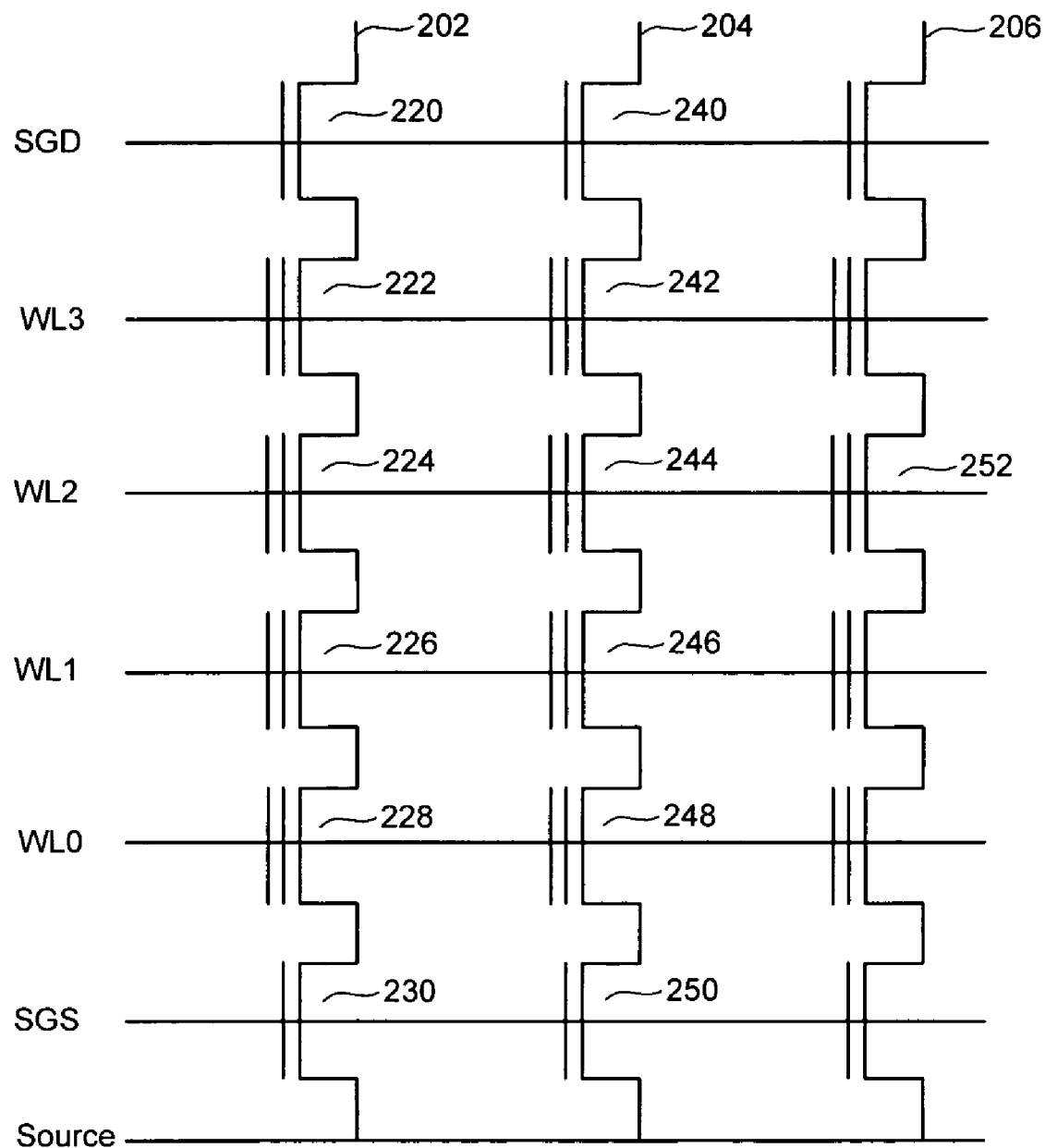

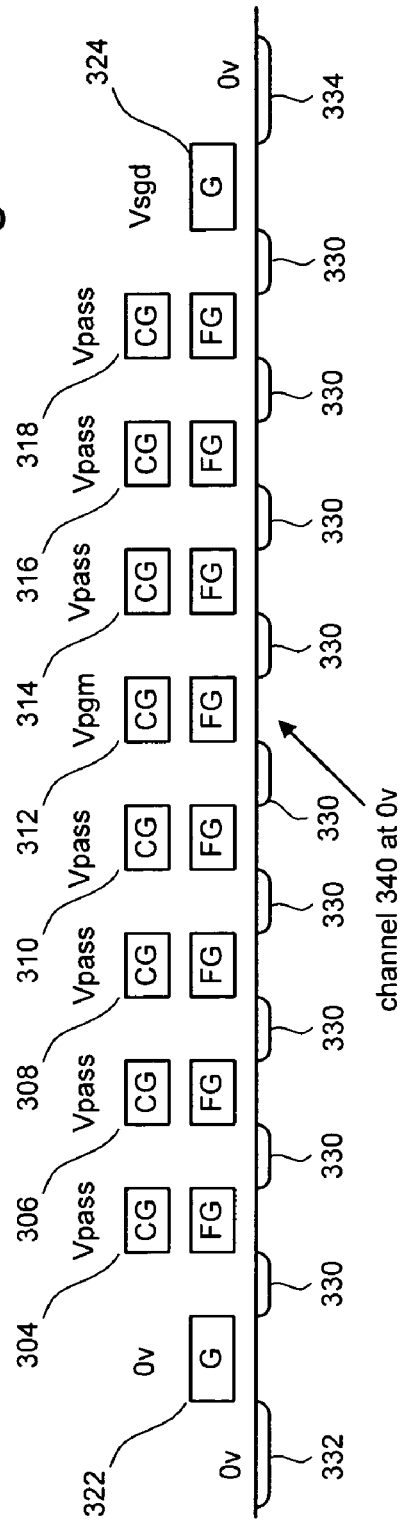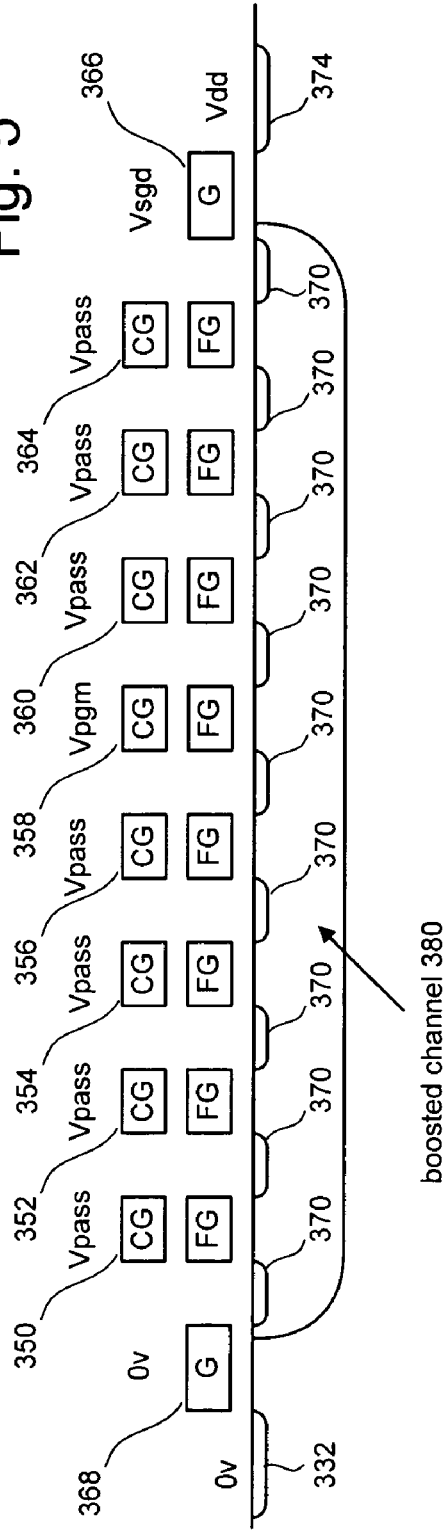

US 7,499,326 B2

1

APPARATUS FOR REDUCING THE IMPACT OF PROGRAM DISTURB

CLAIM OF PRIORITY

This application claims the benefit of U.S. Provisional Application No. 60/791,365, "Reducing The Impact Of Program Disturb For A Word Line," Inventor Gerrit Jan Hemink, filed on Apr. 12, 2006, incorporated herein by reference in its entirety.

CROSS-REFERENCE TO RELATED APPLICATIONS

This application is related to the following three United States patent applications, all three of which are incorporated herein by reference in their entirety:

"Reducing The Impact of Program Disturb During Read," Inventor Gerrit Jan Hemink, filed on the same day as the present application;

"Apparatus for Reducing The Impact Of Program Disturb," Inventor Gerrit Jan Hemink, filed on the same day as the present application; and "Apparatus for Reducing The Impact of Program Disturb During Read," Inventor Gerrit Jan Hemink, filed on the same day as the present application.

BACKGROUND OF THE INVENTION

1. Field of the Invention

The present invention relates to a non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Many types of EEPROM and flash memories utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain) select gate 120 and a second (or source) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 shows four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors (also called gates) and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its source select gate (e.g. select transistor 230 and select transistor 250). A selection line SGS is used to control the source select gates (e.g., 230 and 250).

The various NAND strings are connected to respective bit lines by select transistors 220, 240, etc., which are controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

The word lines (WL3, WL2, WL1 and WL0) comprise the rows of the array. Word line WL3 is connected to the control gates for memory cell 222 and memory cell 242. Word line WL2 is connected to the control gates for memory cell 224, memory cell 244 and memory cell 252. Word line WL1 is connected to the control gates for memory cell 226 and memory cell 246. Word line WL0 is connected to the control gates for memory cell 228 and memory cell 248.

Each memory cell can store data (analog or digital). When storing one bit of digital data (referred to as a binary memory cell), the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00".

Relevant examples of NAND type flash memories and their operation are provided in the following U.S. patents/patent applications, all of which are incorporated herein by reference: U.S. Pat. Nos. 5,570,315; 5,774,397; 6,046,935; 6,456, 528; and U.S. Pat. Publication No. US2003/0002348. The discussion herein can also apply to other types of flash memory in addition to NAND as well as other types of non-volatile memory.

When programming a flash memory cell, a program voltage is applied to the control gate and the bit line is grounded. Due to the voltage differential between the channel of the flash memory cell and the floating gate, electrons from the channel area under the floating gate are injected into the floating gate. When electrons accumulate in the floating gate, the floating gate becomes negatively charged and the threshold voltage of the memory cell is raised. To apply the program voltage to the control gate of the cell being programmed, that program voltage is applied on the appropriate word line. As discussed above, that word line is also connected to one memory cell in each of the other NAND strings that utilize the same word line. For example, when programming memory cell 224 of FIG. 3, the program voltage will also be applied to the control gate of memory cell 244 because both memory cells share the same word line. A problem arises when it's desired to program one cell on a word line without programming other cells connected to the same word line, for example, when it's desired to program memory cell 224 and not memory cell 244. Because the program voltage is applied to all memory cells connected to a word line, an unselected memory cell (a memory cell that is not to be programmed) on the same word line may become inadvertently programmed. For example, memory cell 244 is adjacent to memory cell 224. When programming memory cell 224, there is a concern that memory cell 244 might unintentionally be programmed. The unintentional programming of the unselected memory cell on the selected word line is referred to as "program disturb."

Several techniques can be employed to prevent program disturb. In one method known as "self boosting," the unselected NAND strings are electrically isolated from the corresponding bit lines and a pass voltage (e.g. 7-10 volts, but not limited to this range) is applied to the unselected word lines during programming. The unselected word lines couple to the channel area of the unselected NAND strings, causing a voltage (e.g., 6-10 volts) to exist in the channel of the unselected NAND strings, thereby reducing program disturb. Self boosting causes a boosted voltage to exist in the channel which lowers the voltage differential across the tunnel oxide and hence reduces program disturb. Note that the boosted channel voltage can vary largely since the boosted channel voltage depends on the value of the pass voltage and also on the state of the memory cells, with boosting being most efficient (highest channel voltage) when all memory cells in the NAND string are in the erased state.

FIGS. 4 and 5 depict NAND strings that are being programmed and inhibited using the self-boosting method. FIG. 4 depicts a NAND string being programmed. The NAND string of FIG. 4 includes eight memory cells 304, 306, 308, 310, 312, 314, 316 and 318. Each of those eight memory cells includes a floating gate (FG) and a control gate (CG). Between each of the floating gates are source/drain regions 330. In some implementations, there is a P-type substrate (e.g., Silicon), an N-well within the substrate and a P-well within the N-well (all of which are not depicted to make the drawings more readable). Note that the P-well may contain a so called channel implantation that is usually a P-type implantation that determines or helps to determine the threshold voltage and other characteristics of the memory cells. The source/drain regions 330 are N+ diffusion regions that are formed in the P-well.

At one end of the NAND string is a drain side select gate 324. The drain select gate 324 connects the NAND string to the corresponding bit line via bit line contact 334. At another end of the NAND string is a source select gate 322. Source select gate 322 connects the NAND string to common source line 332. During programming, the memory cell selected for programming (e.g., memory cell 312) receives a program voltage Vpgm on its associated word line. The program voltage Vpgm can typically vary between 12 to 24 volts. In one embodiment, the program voltage signal is a set of pulses which increase in magnitude with each new pulse. A pass voltage Vpass of approximately 8 volts is applied to the control gates of the memory cells that are not selected for programming. Source select gate 322 is in an isolating state, receiving 0 volts at its gate (G). A low voltage is applied to the common source line 332. This low voltage can be zero volts. However, the source voltage can also be slightly higher than zero volts to provide better isolation characteristics of the source side select gate. A voltage Vsgd, which is typically in the range of the power supply voltage Vdd (e.g., 2.5 volts), is applied to drain side select gate 324. Zero volts is applied to bit line contact 334 via the corresponding bit line to enable programming of the selected memory cell 312. Channel 340 is at or close to zero volts. Because of the voltage differential between the channel and the floating gate of memory cell 314, electrons tunnel through the gate oxide (also commonly referred to as tunnel oxide) into the floating gate by Fowler-Nordheim tunneling.

The NAND string of FIG. 5 depicts a NAND string being inhibited from programming. The NAND string includes eight memory cells 350, 352, 354, 356, 358, 360, 362 and 364. The NAND string also includes drain select gate 366 connecting the NAND string to the corresponding bit line via bit line contact 374, and source select gate for 368 connecting the NAND string to common source line 332. Between each of the floating gate stacks are source/drain regions 370. The NAND string of FIG. 5 has Vsgd applied to the gate of the drain select gate 366, zero volts applied to the gate of the source side select gate 368 and zero volts (or a slightly higher voltage) at the common source line 332. Bit line contact 374 receives the power supply voltage Vdd via the corresponding bit line in order to inhibit the programming of memory cell 358.

When Vdd is applied, the drain select transistor 366 will initially be in a conducting state; therefore, the channel area under the NAND string will partly be charged up to a higher potential (higher than zero volts and typically equal or almost equal to Vdd). This charging is commonly referred to as pre-charging. The pre-charging will stop automatically when the channel potential has reached Vdd or a lower potential given by Vsgd−Vt, where Vt equals the threshold voltage of the drain select gate 366. In general, during pre-charging, Vsgd is chosen in such a way that Vsgd−Vt>Vdd so that the channel area under the NAND string can be pre-charged to Vdd. After the channel has reached that potential, the select gate transistor is non-conducting or made non-conducting by lowering Vsgd to a value similar to Vdd (e.g. 2.5 volts). Subsequently, the voltages Vpass and Vpgm are ramped up from zero volts to their respective final values (not necessarily at the same time), and because the drain side select gate transistor 366 is in a non-conducting state, the channel potential will start to rise because of the capacitive coupling between the word lines and the channel area. This phenomenon is called self boosting. It can be seen from FIG. 5 that channel 380 is boosted, more or less uniformly, to a boosting voltage. Because the voltage differential between the floating gate of memory cell 358 and channel 380 has been reduced, programming is inhibited. More information about programming NAND flash memory, including self boosting techniques, can be found in U.S. Pat. No. 6,859,397, "Source Side Self Boosting Technique for Non-Volatile Memory," Lutze at al., incorporated herein by reference in its entirety.

Another attempt to address program disturb is Erased Area Self Boosting ("EASB"). EASB attempts to isolate the channel of previously programmed cells from the channel of the cell being inhibited. In the EASB method, the channel area of the selected NAND string is divided into two areas. An area at the source side of the selected word line that can contain a number of programmed (or erased cells) memory cells and an area at the drain side of the selected word line in which the cells are still in the erased state, or at least not yet in the final programmed state. The two areas are separated by a word line that is biased to a low voltage, typically zero volts. Because of this separation, the two areas can be boosted to different potentials. In almost all cases, the area at the drain side of the selected word line will be boosted to a higher potential than the area at the source side. Since the highest boosted area is the area with the erased cells, this boosting method is referred to as Erased Area Self Boosting (EASB).

Although the above boosting methods have reduced program disturb, they have not eliminated the problem. One effect that can occur to the memory cell next to the source select gate (e.g., memory cell 350 is next to source select gate 368 of FIG. 5) is Gate Induced Drain Leakage (GIDL), which is also referred to as Band-To-Band-Tunneling. GIDL causes the generation of electrons at the source select gate when the channel under the NAND string is inhibited from programming (boosted to a high voltage). Subsequently, the generated electrons are accelerated in the strong lateral electric field towards the floating gate of the memory cell next to the source select gate. Some of the electrons can gain sufficient energy to be injected into the tunnel oxide under the floating gate or in the floating gate itself and, thus modify the threshold voltage of the corresponding memory cell.

FIG. 6 shows a portion of the NAND string of FIG. 5, with a zooming-in on the drain and a portion of the channel for memory cell 350. Due to boosting of the NAND string during a program inhibit operation (for example when other NAND strings are being programmed), a high voltage is present in the channel area of the boosted NAND string (see boosted channel 380). This high voltage is also present at the junction area between source select gate 368, which is typically biased at 0V, and memory cell 350 next to source select gate 368. This bias condition may cause GIDL, which can result in the creation of electron hole pairs. The holes will go to P-well area 384. The electrons will move to the boosted channel area 380. In general, there is a lateral electric field present in the junction area between the source select gate and the memory cell next to the source side select gate because part of that junction (drain/source) is depleted due to the large voltage difference between channel area under the memory cells and the channel area under the select gate. The electrons can be accelerated in the electric field and may gain enough energy to be injected in the tunnel oxide of the memory cell next to the source side select gate or may even reach the floating gate of that memory cell. In both cases, the threshold voltage of the corresponding memory cell will change due to the presence of the injected electrons, thereby, risking an error when reading the memory cell next to the source select gate.

Thus, there is a need for a new mechanism to reduce the impact of program disturb.

SUMMARY OF THE INVENTION

A system is proposed for programming and/or reading non-volatile storage elements that reduces the effect of program disturb. In one set of implementations, different verify levels are used for a particular word line (or other grouping of storage elements) during a programming process. For one set of examples that use multi-state devices, the target level for one programmed state, two programmed states, another subset of programmed states, or all of the programmed states can be different. In some embodiments, different pages of data associated with the particular word line (or other grouping of storage elements) could use different (one, two, another subset or all) target levels. In other embodiments, different storage elements associated with the particular word line (or other grouping of storage elements) could use different (one, two, another, subset or all) target levels. In one embodiment, the word line that receives the different target levels is chosen based on its position relative to a boosted region.

One embodiment includes programming a group of non-volatile storage elements using a group of target levels and programming a particular set of non-volatile storage elements using a particular set of target levels so that threshold distributions of the particular set of non-volatile storage elements are within corresponding threshold distributions of the group of non-volatile storage elements upon completion of a programming process. At least one of the particular set of target levels is below a corresponding target level of the group of target levels.

One embodiment includes programming a group of non-volatile storage elements using a group of target levels and programming a particular set of non-volatile storage elements using a particular set of target levels so that threshold voltage distributions of the particular set of non-volatile storage elements are shifted to at least protrude less (including not protruding at all) from corresponding threshold voltage distributions of the group of non-volatile storage elements upon completion of a programming process, at least one of the particular set of target levels is below a corresponding target level of the group of target levels.

One embodiment includes programming a set of one or more non-volatile storage elements using a group of target levels and programming a particular non-volatile storage element using a particular set of target levels. At least one of the particular set of target levels is below a corresponding target level of the group of target levels. The particular non-volatile storage element is adjacent to a source select gate.

One embodiment includes programming a first set of one or more non-volatile storage elements using a first set of target levels and programming a second set of one or more non-volatile storage elements using a second set of target levels after programming the first set of one or more non-volatile storage elements. The first set of one or more non-volatile storage elements are programmed first. The first set of one or more non-volatile storage elements are connected to a first word line and the second set of one or more non-volatile storage elements are connected to a set of word lines programmed after the first word line during a sequence of programming operations. The second set of target levels is different than the first set of target levels.

A system is proposed for programming and/or reading non-volatile storage that reduces the effect of program disturb. In one set of implementations, different read compare values are used for a particular word line (or other grouping of storage elements) during a read process. The word line that will receive the different read compare values is chosen based on position of the word line with respect to the position of a boosting region during the programming process.

One embodiment includes reading a first set of non-volatile storage elements using a first set of read compare values and reading a second set of one or more non-volatile storage elements using a second set of read compare values. The first set of non-volatile storage elements are connected to a first control line. The second set of non-volatile storage elements are connected to a second set of control lines different than the first control line. At least one of the first set of read compare values is different than a corresponding compare level of the second set of read compare values. In one example of an implementation (but not all implementations), the first control line is next to a source select control line.

One embodiment includes programming a first set of non-volatile storage elements using a first set of target levels and programming a second set of one or more non-volatile storage elements using the same first set of target levels. The first set of non-volatile storage elements is associated with a first control line. The first control line is adjacent to a second control line. The process also includes providing a programming signal on the first control line and providing a signal on the second control line requiring non-volatile storage elements connected to the second control line to turn off in response to the signal. The second set of one or more non-volatile storage elements are associated with a set of control lines. The first control line and the second control line are not in the set of control lines. The first set of one or more non-volatile storage elements are read using a first set of read compare values. The second set of one or more non-volatile storage elements are read using a second set read compare values. At least one of the first set of read compare values is different than a corresponding compare level of the second set of read compare values.

The various methods described herein can be performed by various devices. One example of a suitable apparatus includes non-volatile storage elements and a managing circuit in communication with the non-volatile storage elements. The non-volatile storage elements include a first set of non-volatile storage elements and a second set of non-volatile storage elements. The managing circuit performs the various methods described herein in relation to the first set of non-volatile storage elements and the second set of non-volatile storage elements. In one embodiment, the managing circuit includes any one or a combination of a controller, a state machine, command circuits, control circuits and decoders. In other embodiments, the managing circuit can also include other elements suitable for the particular implementations.

BRIEF DESCRIPTION OF THE DRAWINGS

FIG. 3 is a schematic diagram depicting three NAND strings.
FIG. 4 shows a NAND string being programmed.
FIG. 5 shows a NAND string being inhibited, using a self boosting method.

DETAILED DESCRIPTION

Figure 7:
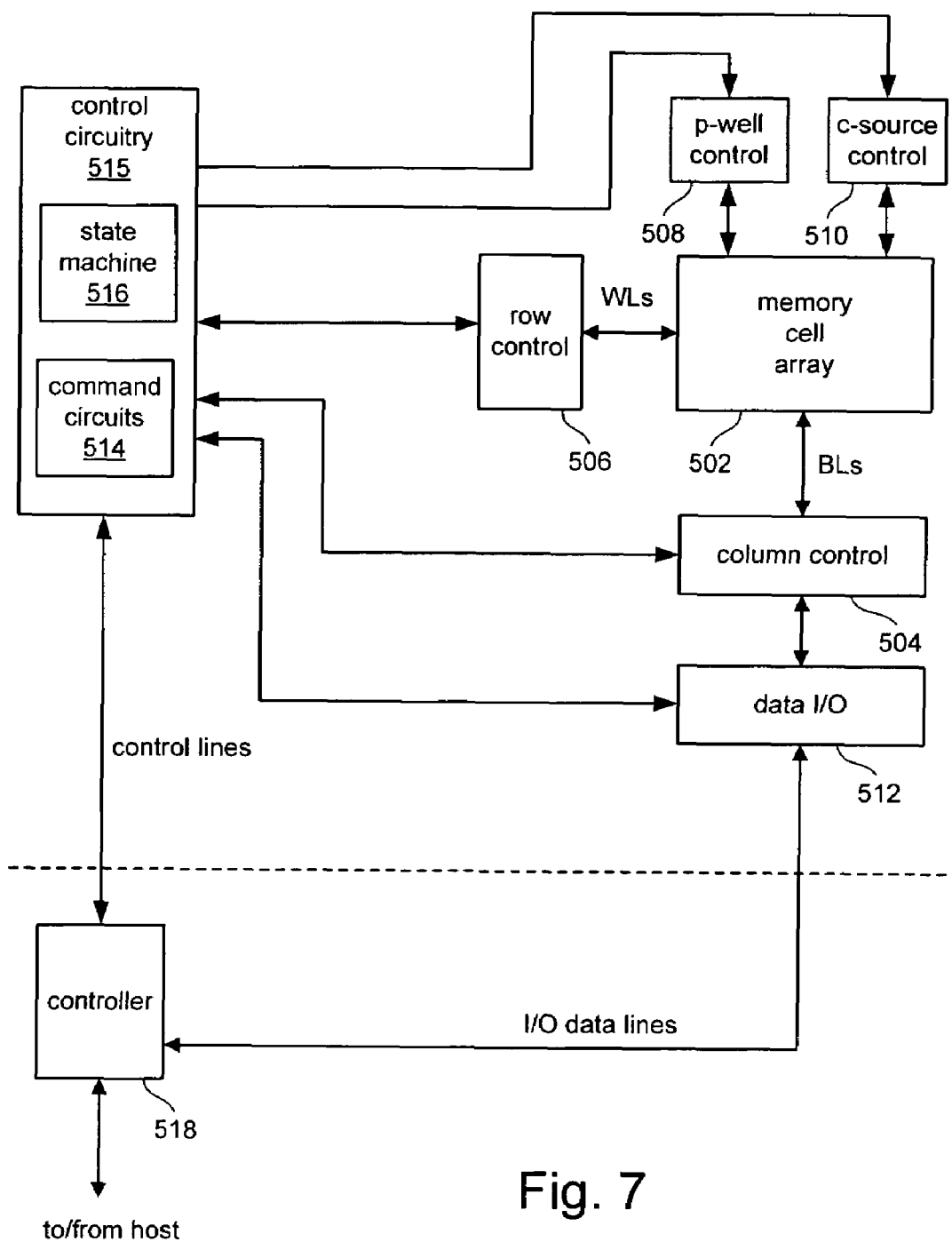
FIG. 7 is a block diagram of one example of a memory system.

FIG. 7 is a block diagram of one embodiment of a flash memory system that can be used to implement one or more embodiments described herein. Other systems and implementations can also be used. Memory cell array 502 is controlled by column control circuit 504, row control circuit 506, p-well control circuit 508 and c-source control circuit 510. Column control circuit 504 is connected to the bit lines of memory cell array 502 for reading data stored in the memory cells, for determining a state of the memory cells during a program operation, and for controlling potential levels of the bit lines to promote or inhibit programming and erasing. Row control circuit 506 is connected to the word lines to select one of the word lines, to apply read voltages, to apply program voltages combined with the bit line potential levels controlled by column control circuit 504, and to apply an erase voltage. In one embodiment, row control 306 and column control 304 include decoders to select the appropriate word lines and bit lines. C-source control circuit 510 controls a common source line (labeled as "C-source" in FIG. 8) connected to the memory cells. P-well control circuit 508 controls the p-well voltage.

The data stored in the memory cells is read out by the column control circuit 504 and is output to external I/O lines via data input/output buffer 512. Program data to be stored in the memory cells is input to the data input/output buffer 512 via the external I/O lines, and transferred to the column control circuit 504. The external I/O lines are connected to controller 518.

Command data for controlling the flash memory device is input to controller 518. The command data informs the flash memory of what operation is requested. The input command is transferred to state machine 516 which is part of control circuitry 515. State machine 516 controls column control circuit 504, row control circuit 506, c-source control 510, p-well control circuit 508 and data input/output buffer 512. State machine 516 can also output status data of the flash memory such as READY/BUSY or PASS/FAIL.

Controller 518 is connected to or connectable with a host system such as a personal computer, a digital camera, or personal digital assistant, etc. It communicates with the host that initiates commands, such as to store or read data to or from the memory array 502, and provides or receives such data. Controller 518 converts such commands into command signals that can be interpreted and executed by command circuits 514 which are part of control circuitry 515. Command circuits 514 are in communication with state machine 516. Controller 518 typically contains buffer memory for the user data being written to or read from the memory array.

One exemplary memory system comprises one integrated circuit chip that includes controller 518, and one or more integrated circuit chips that each contain a memory array and associated control, input/output and state machine circuits. The memory arrays and controller circuits of a system can be integrated on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

In some implementations, some of the components of FIG. 7 can be combined. In various designs, one or more of the components of FIG. 7 (alone or in combination), other than memory cell array 502, can be thought of as a managing circuit. For example, a managing circuit may include any one of or a combination of control circuitry 515, command circuits 514, state machine 516, column control circuit 504, row control circuit 506, p-well control circuit 508, c-source control circuit 510 and data I/O 512.

Figure 8:
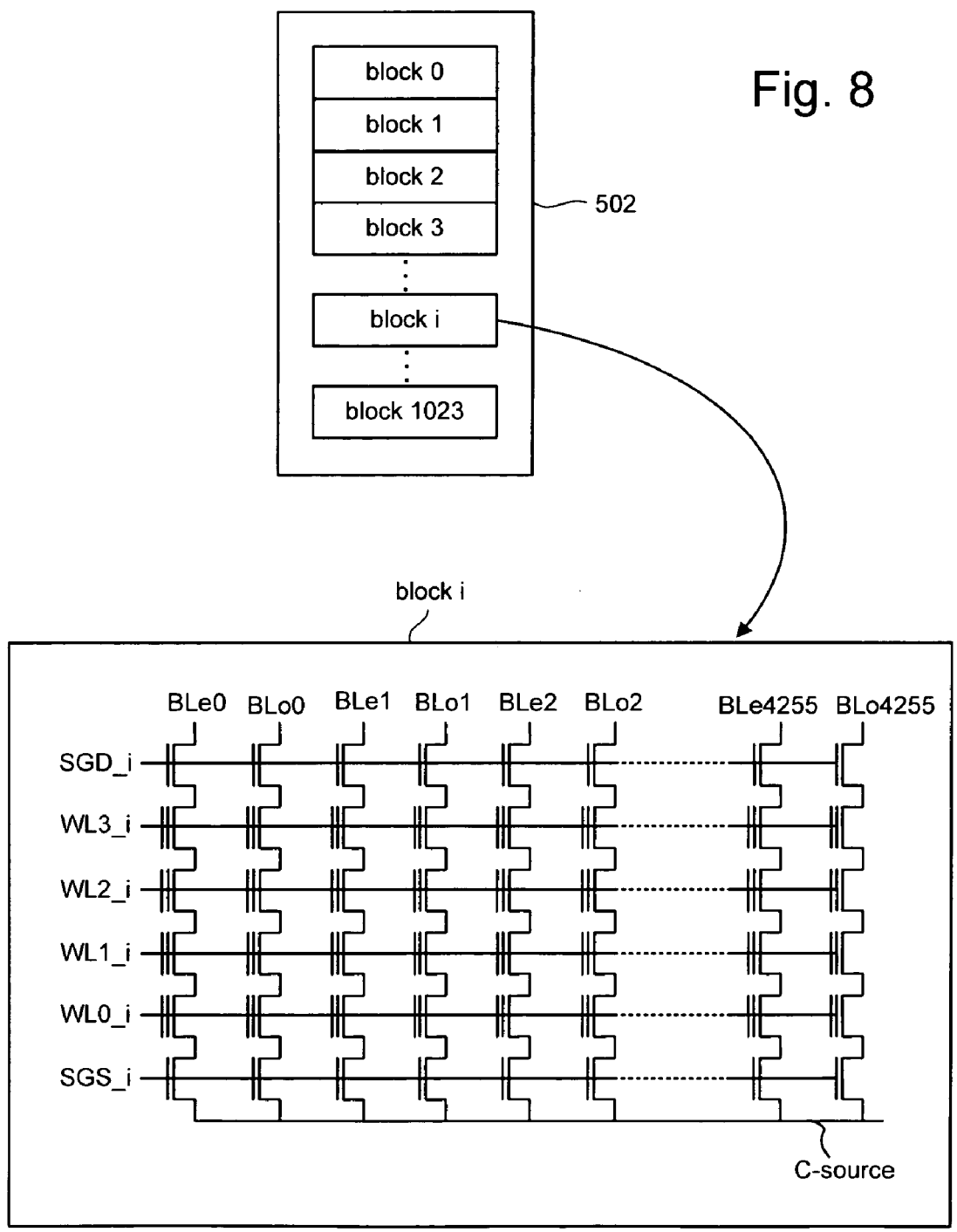
FIG. 8 illustrates an example of an organization of a memory array.

With reference to FIG. 8, an exemplary structure of memory cell array 502 is described. As one example, a NAND flash EEPROM is described that is partitioned into 1,024 blocks. The data stored in each block can be simultaneously erased. In one embodiment, the block is the minimum unit of memory cells that are simultaneously erased. In each block, in this example, there are 8,512 columns. Each block is typically divided into a number of pages which can be a unit of programming. Other units of data for programming are also possible. In one embodiment, individual pages may be divided into segments and the segments may contain the fewest number of cells that are written at one time as a basic programming operation. One or more pages of data are typically stored in one row of memory cells.

In each block of the example in FIG. 8 there are 8,512 columns that are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 8 shows four memory cells connected in series to form a NAND string. Although four cells are shown to be included in each NAND string, more or less than four can be used (e.g., 16, 32, or another number). One terminal of the NAND string is connected to a corresponding bit line via a drain select gate (connected to select gate drain line SGD), and another terminal is connected to c-source via a source select gate (connected to select gate source line SGS).

In other embodiments, the bit lines are not divided into odd and even bit lines. Such architectures are commonly referred to as all bit line architectures. In an all bit line architecture, all the bit lines of a block can be simultaneously selected during read and program operations. Memory cells along a common word line and connected to any bit line can be programmed at the same time.

In another embodiment the bit lines are divided into planes. For example, there can be a left plane (left most 4256 bit lines) and a right plane (right most 4256 bit lines). Each plane can be programmed separately or both planes can be programmed at the same time. In some embodiments, there can be more than two planes. Other arrangements can also be used.

During read and programming operations of one embodiment using an odd/even bit line architecture, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-state cell), one block stores 16 pages. Other sized blocks and pages can also be used. Additionally, architectures other than that of FIGS. 7 and 8 can also be used to implement embodiments.

In the read and verify operations, the select gates of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a binary memory cell, the selected word line WL2 is grounded, so that it is detected whether the threshold voltage is higher than 0V. In a verify operation of a binary memory cell, the selected word line WL2 is connected to 0.8V, for example, so that as programming progresses it is verified whether or not the threshold voltage has reached the target level of 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation. In another embodiment, a memory cell can be read by detecting the current conducted by a memory cell.

When programming a memory cell in one example, the drain and the p-well receive 0 volts while the control gate receives a series of programming pulses with increasing magnitudes. In one embodiment, the magnitudes of the pulses in the series range from 12 volts to 24 volts. In other embodiments, the range of pulses in the series can be different. The magnitude of the pulses is increased with each pulse by a predetermined step size. In one embodiment that includes the memory cells storing multiple bits of data, an exemplary step size is 0.2 volts (or 0.4 volts). During programming of memory cells, verify operations are carried out in the periods between the programming pulses. The cells that are verified to be sufficiently programmed are locked out, for example in NAND cells, by raising the bit line voltage from 0 to $V_{DD}$ (e.g., 2.5 volts) for all subsequent programming pulses to terminate the programming process for those memory cells.

Figure 9:
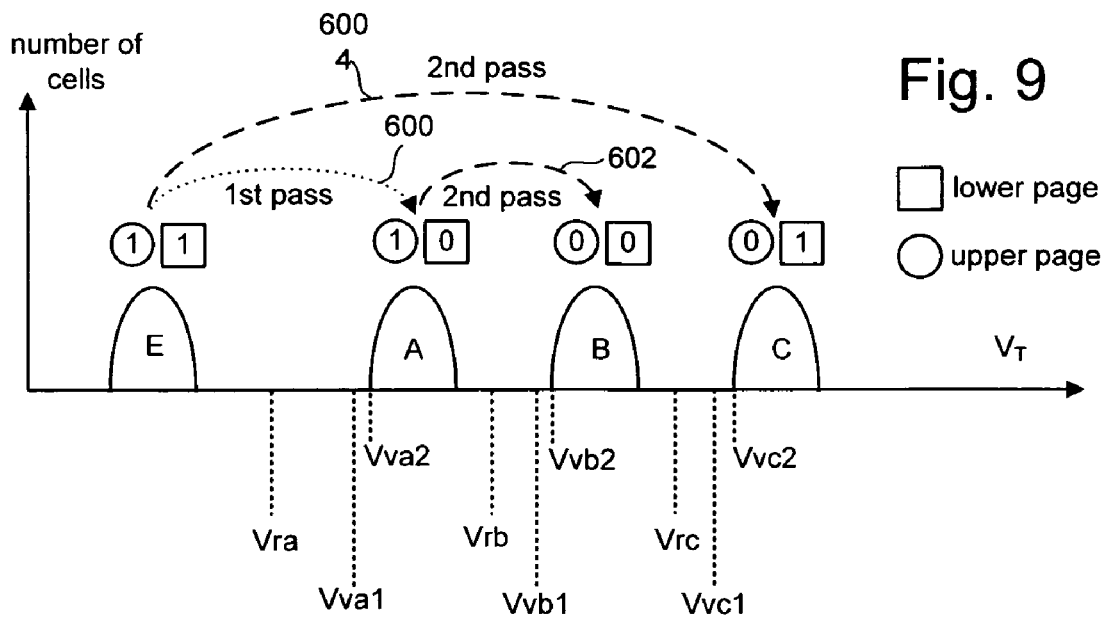
FIG. 9 depicts a set of threshold voltage distributions.

At the end of a successful program process, the threshold voltages of the memory cells should be within one or more distributions of threshold voltages for programmed memory cells or within a distribution of threshold voltages for erased memory cells, as appropriate. FIG. 9 illustrates example threshold voltage distributions for the memory cell array when each memory cell stores two bits of data. FIG. 9 shows a first threshold voltage distribution E for erased memory cells. Three threshold voltage distributions, A, B and C for programmed memory cells, are also depicted. In one embodiment, the threshold voltages in the E distribution (also referred to as physical state E) are negative and the threshold voltages in the A, B and C distributions (also referred to as physical states A, B and C) are positive.

Each distinct threshold voltage range of FIG. 9 corresponds to predetermined values for the set of data bits. The specific relationship between the data programmed into the memory cells and the threshold voltage levels of the memory cells depends upon the data encoding scheme adopted for the memory cells. For example, U.S. Pat. No. 6,222,762 and U.S. Patent Publication 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 9 shows four states, the present invention can also be used with other multi-state structures including those that include more or less than four states.

FIG. 9 shows three read compare values—voltages Vra, Vrb and Vrc—for reading data from memory cells. By testing whether the threshold voltage of a given memory cell is above or below Vra, Vrb and Vrc, the system can determine what state the memory cell is in.

Figure 11:
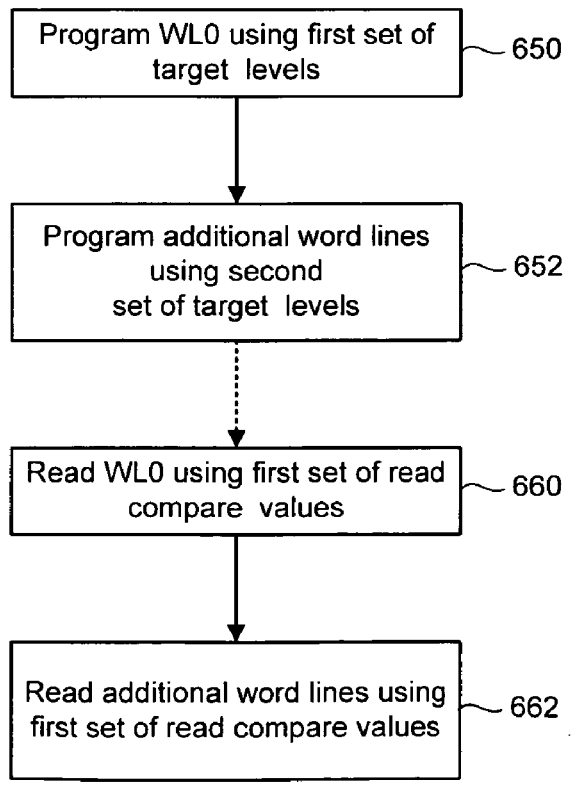
FIG. 11 is a flow chart describing one embodiment of a process for programming and reading non-volatile memory.

FIG. 11 shows three verify target levels—voltages Vva2, Vvb2 and Vvc2. When programming memory cells to state A, the system will test whether those memory cells have a threshold voltage greater than or equal to Vva2. When programming memory cells to state B, the system will test whether the memory cells have threshold voltages greater than or equal to Vvb2. When programming memory cells to state C, the system will determine whether memory cells have their threshold voltage greater than or equal to Vvc2.

In one embodiment, known as full sequence programming, memory cells can be programmed from the erase state E directly to any of the programmed states A, B or C. While some memory cells are being programmed from state E to state A, other memory cells are being programmed from state E to state B and/or from state E to state C.

In addition to the full sequence programming discussed above, FIG. 9 also illustrates an example of a two-pass technique of programming a multi-state memory cell that stores data for two different pages: a lower page and an upper page. For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the memory cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 600. That concludes the first programming pass.

In a second programming pass, the memory cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 604. If the cell had been programmed into state A as a result of the first programming pass, then the memory cell is further programmed in the second pass so that the threshold voltage is increased to be within state B, as depicted by arrow 602. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Figure 10A:
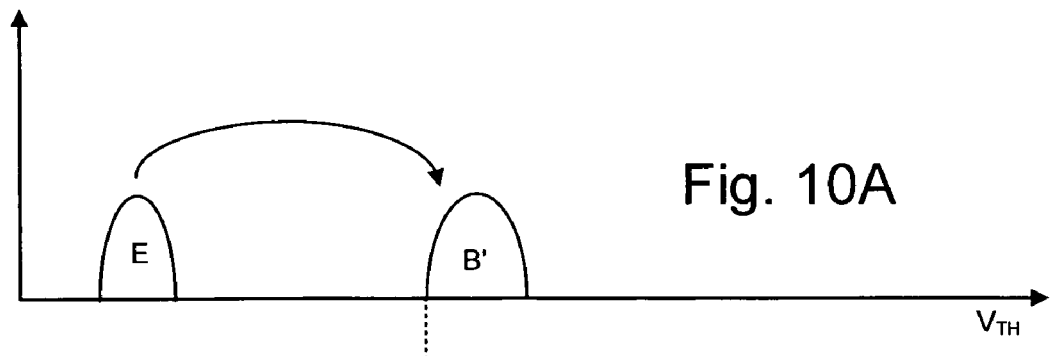
FIGS. 10A, 10B and 10C depict threshold voltage distributions.
Figure 10B:
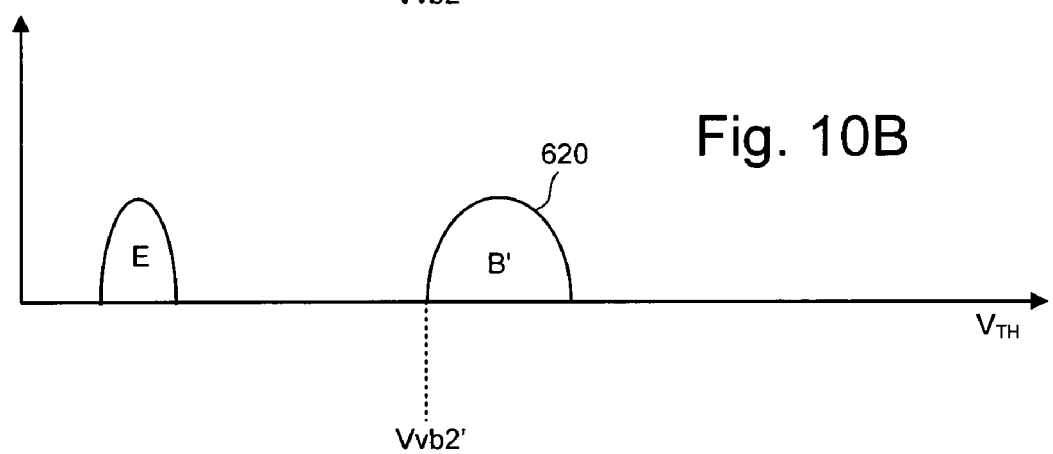
Figure 10C:
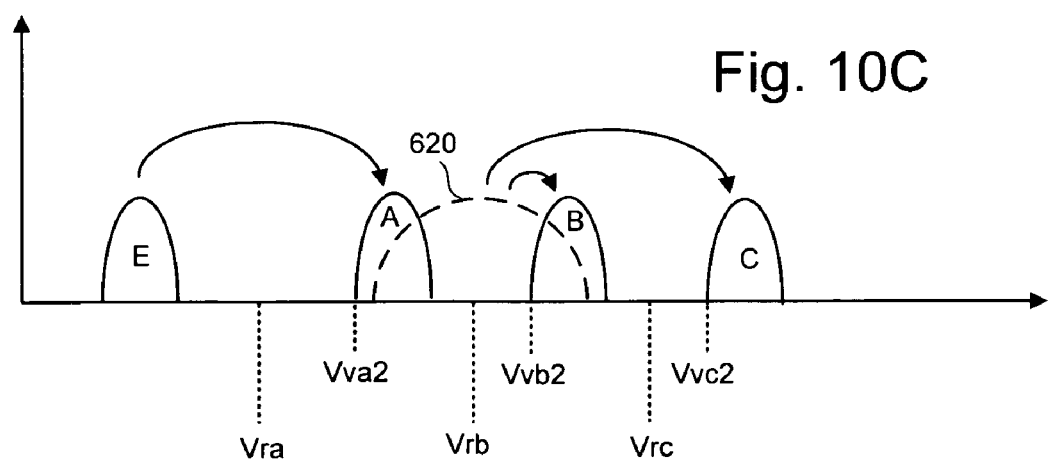

FIGS. 10A-C disclose another process for programming non-volatile memory that reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 10A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIGS. 10A-C, the upper page data is 0 and the lower page data is 1. With reference to state B, the upper page data is 1 and the lower page data is 0. With reference to state C, both pages store data 0.

The programming process of FIGS. 10A-C is a two-step process. In the first step, the lower page is programmed. If the lower page is to remain data 1, then the memory cell state remains at state E. If the data is to be programmed to 0, then the threshold voltage of the memory cell is raised such that the memory cell is programmed to state B'. FIG. 10A therefore shows the programming of memory cells from state E to state B'. State B' depicted in FIG. 10A is an interim state B; therefore, the verify target level is depicted as Vvb2', which is lower than Vvb2.

Figure 1:
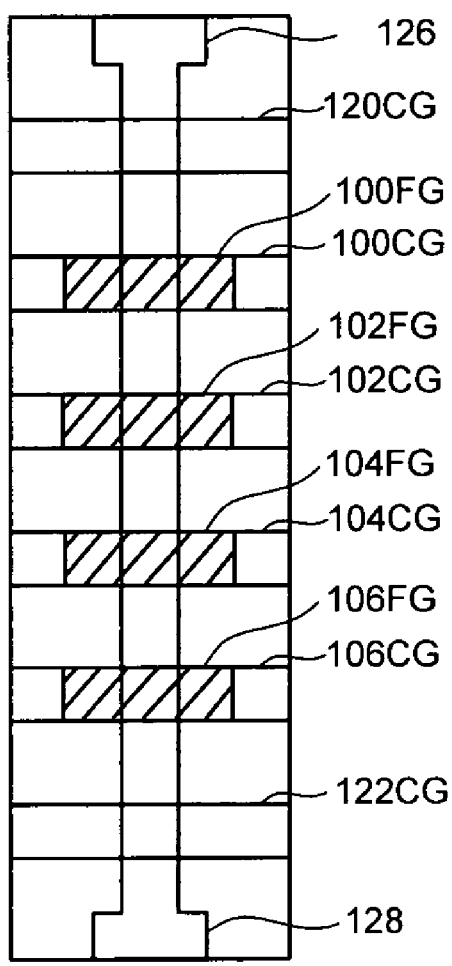
FIG. 1 is a top view of a NAND string.
Figure 2:
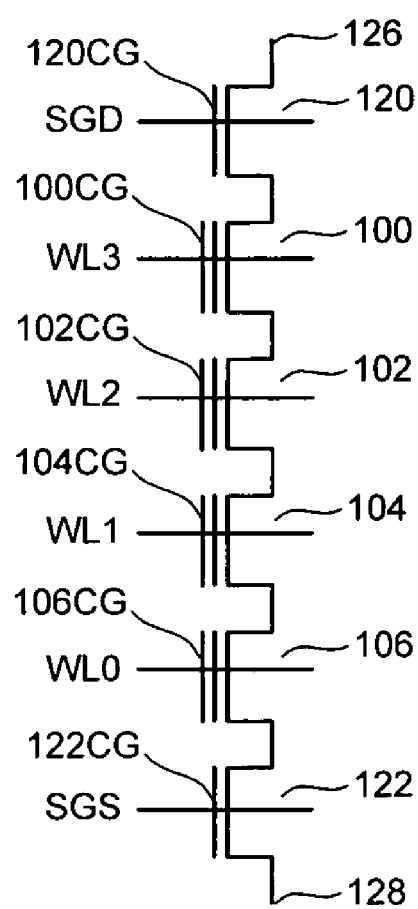
FIG. 2 is an equivalent circuit diagram of the NAND string.
Figure 6:
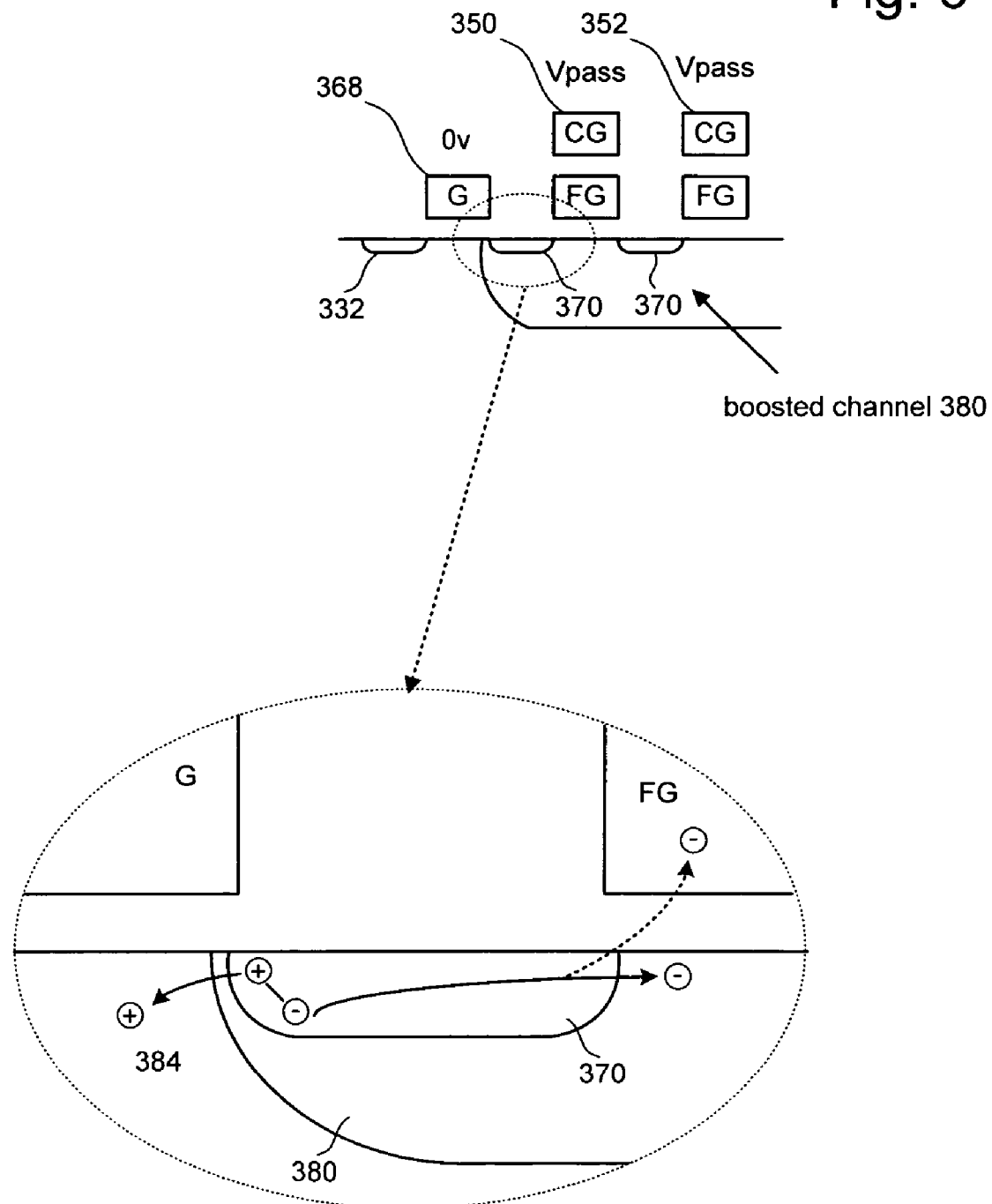
FIG. 6 depicts a portion of a NAND string.

In one embodiment, after a memory cell is programmed from state E to state B', its neighbor memory cell in the NAND string will then be programmed with respect to its lower page. For example, looking back at FIG. 2, after the lower page for memory cell 106 is programmed, the lower page for memory cell 104 would be programmed. After programming memory cell 104, the floating gate to floating gate coupling effect will raise the apparent threshold voltage of memory cell 106 if memory cell 104 had a threshold voltage raised from state E to state B'. This will have the effect of widening the threshold voltage distribution for state B' to that depicted as threshold voltage distribution 620 of FIG. 10B. This apparent widening of the threshold voltage distribution will be remedied when programming the upper page.

FIG. 10C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 620 and the upper page data is to remain at 1, then the memory cell will be programmed to final state B. If the memory cell is in intermediate threshold voltage distribution 620 and the upper page data is to become data 0, then the threshold voltage of the memory cell will be raised so that the memory cell is in state C. The process depicted by FIGS. 10A-C reduces the effect of floating gate to floating gate coupling because the maximum Vt shift during the upper page programming is reduced as cells are programmed from the E state to A state or from the B' state to the C-state instead of from the E to C state in FIG. 9, as a result, the upper page programming of neighbor memory cells will have less effect on the apparent threshold voltage of a given memory cell. Although FIGS. 10A-C provide an example with respect to four data states and two pages of data, the concepts taught by FIGS. 10A-C can be applied to other implementations with more or less than four states and more or less than two pages.

Note that there are various orders for programming the various pages. The current invention can be used with many different orders for programming the various pages, as suitable for the particular implementation. More information on programming can be found in U.S. patent application Ser. No. 11/099,133, "Compensating for Coupling During Read Operations of Non-Volatile Memory," filed on Apr. 5, 2005 by Jian Chen, incorporated herein by reference in its entirety.

In order to reduce the effect of program disturb, different target verify levels can be used for a particular word line (or other grouping of storage elements) during the verify step(s) of a programming process. FIG. 11 provides a flow chart explaining one embodiment of a process that uses one set of target levels for the word line next to the source select gates and source select line, and another set of target levels for the other word lines. In step 650 of FIG. 11, word line WL0, the first word line to be programmed and the word line next to the source select line SGS (see FIGS. 2, 3 and 8) is programmed using a first set of target levels. That is, all or a subset of the memory cells connected to WL0 are programmed using the first set of target levels to verify whether the respective memory cells have completed programming. In step 652, the remaining (or another subset of) word lines are programmed using a second set of target levels. That is, for example, all or a subset of the memory cells connected to WL1-WL4 are programmed using the second set of target levels to verify whether the respective memory cells have completed programming. Looking back at FIG. 5, word line WL0 is at the edge of boosting regions 380.

In one embodiment, the first set of target levels includes Vva1, Vvb1 and Vvc1; and the second set of target levels includes Vva2, Vvb2 and Vvc2. In one example implementation, Vva1 is in the order of 100 to 200 mV lower than the corresponding Vva2, Vvb1 is in the order of 100 to 200 mV lower than the corresponding Vvb2, and Vvc1 is in the order of 100 to 200 mV lower than the corresponding Vvc2.

In other embodiments, a subset of the first set of target levels can be the same as a subset of the second set of target level. That is because in some implementations, it may be found that program disturb is only a problem for memory cells in some of the programmed states (e.g., state A, or states A and B). Therefore, in some embodiments, the first set of target levels includes Vva1, Vvb2 and Vvc2 and the second set of target levels includes Vva2, Vvb2 and Vvc2. In other embodiments, the first set of target levels includes Vva1, Vvb1 and Vvc2 and the second set of target levels includes Vva2, Vvb2 and Vvc2. Other permutations can also be implemented.

The target levels of the first and second set of target levels are the compare points used during the programming process to decide when a memory cell has finished programming. For example, a memory cell on WL0 intended to be programmed to state A will finish the programming process when its threshold voltage has reached Vva1 and a memory cell on WL3 intended to be programmed to state B will finish the programming process when its threshold voltage has reached Vvb2.

There are some devices that program using a two phased coarse/fine programming methodology. The first phase, a coarse programming phase, includes attempts to raise the threshold voltage in a faster manner and paying relatively less attention to achieving a tight threshold distribution. The second phase, a fine programming phase, attempts to raise the threshold voltage in a slower manner in order to reach the target threshold voltage while also achieving a tighter threshold distribution. Example of coarse/fine programming methodologies can be found in the following patent documents that are incorporated herein by reference in their entirety: U.S. Patent Publication 2005/0162916 U.S. Pat. Nos. 6,301,161; 5,712,815; 5,220,531; and 5,761,222. When verifying a memory cell during programming, some prior solutions will first perform the verify process for the coarse mode using an intermediate verify level and then subsequently perform the verify process for the fine mode using the target level for verification. The present solution for changing the target levels applies to the target level for verification during the fine mode. In some cases, the intermediate verify level can also be changed.

Figure 12A:
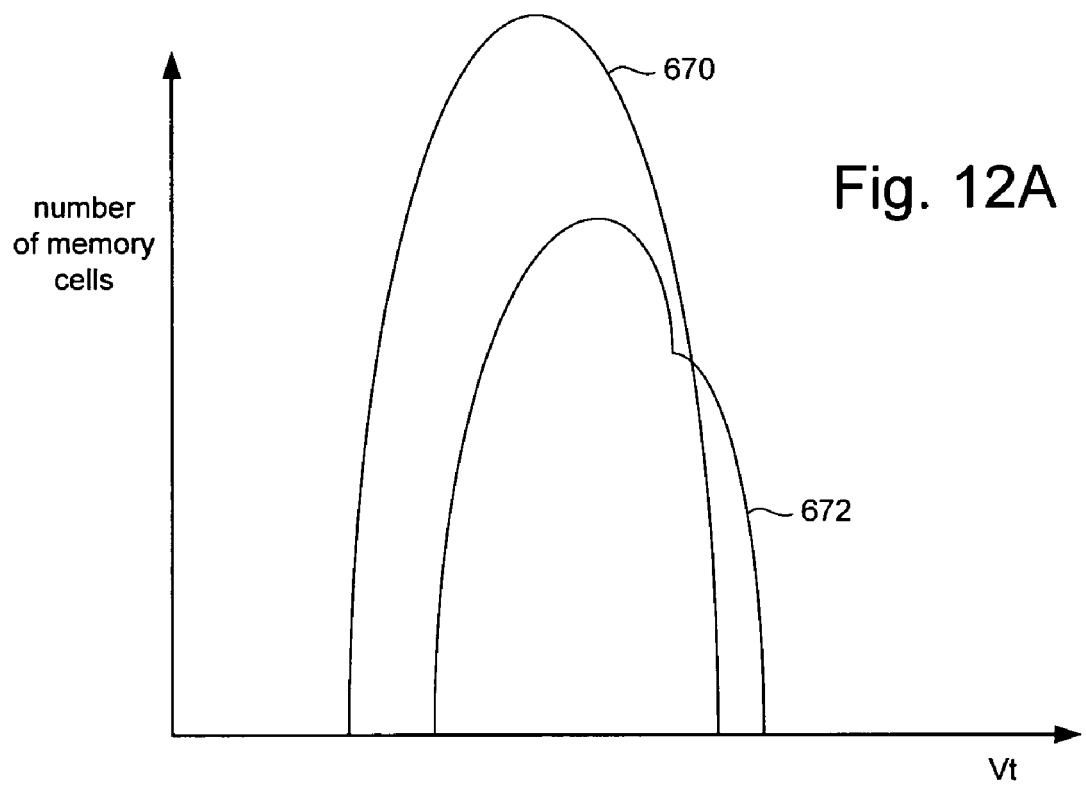
FIGS. 12A and 12B depict threshold voltage distributions.

By lowering target levels for word line WL0, the threshold voltages of the programmed memory cells connected to WL0 should, over the population of memory cells, be lowered in comparison to what they would be if the target levels were not lowered. For example, FIG. 12A shows two threshold distributions for one programmed state (e.g., state A). Distribution 670 represents one example of a threshold voltage distribution (# of memory cells versus threshold voltage) of memory cells connected to all word lines except word line WL0. Distribution 672 represents one example of a threshold voltage distribution of memory cells connected to word line WL0 when all of the word lines use the same target levels. Because of the program disturb described above, distribution 672 is shifted to the right and widened as compared to distribution

670. As can be seen, distribution 672 protrudes out from distribution 670 at the upper end.

Figure 12B:
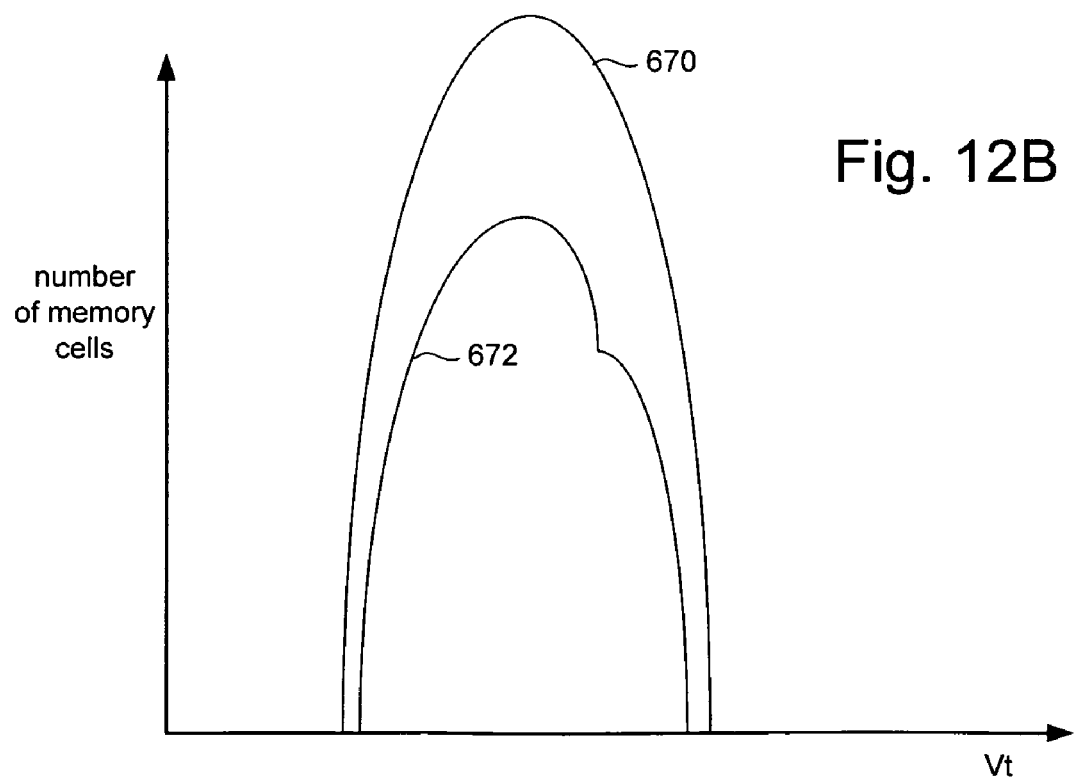

By using a lower set of target levels for word line WL0, as per steps 650 and 652, the threshold voltage distributions for the programmed memory cells associated with WL0 are shifted to the left so that they are within the corresponding threshold voltage distributions associated with the other word lines at the completion of a programming process. For example, FIG. 12B shows distribution 672 shifted to the left after the completion of a programming process (one or many pages programmed to accommodate the storage of a set of data, such as a digital picture or other file) as a result of using lower target levels for WL0 so that distribution 672 fits inside distribution 670. In another embodiment, distribution 672 is shifted to the left after the completion of a programming process (one or many pages programmed to accommodate the storage of a set of data, such as a digital picture or other file) as a result of using lower target levels for WL0 so that distribution 672 at least protrudes out less from distribution 670 at the upper end as compared to the depiction in FIG. 12A. If distribution 672 at least protrudes out less from distribution 670 at the upper end as compared to the depiction in FIG. 12A, then any remaining errors may be fixed during a read process (e.g. using ECC).

Note that distribution 672 and distribution 670 represent one state (e.g., state A, state B, state C, or a different state). In an example, with three programmed states (plus an erased state), there would be up to three pairs of corresponding threshold voltage distributions similar to distribution 672 and distribution 670. In embodiments which contemplate storing more than two bits of information in a memory cell, more than three pairs of threshold voltage distributions similar to distribution 672 and distribution 670 may exist. In some cases, less than all states will have their distribution shifted on WL0.

Looking back at FIG. 11, in step 660 all or a subset of the memory cells connected to WL0 are read using a set of read compare values. For example, the read compare values Vra, Vrb and Vrc (see FIG. 9) can be used to read the data stored in the memory cells. In step 662, all or a subset of the memory cells connected to the word lines other than WL0 are read using the same set of read compare values as used in step 660. Note that the arrow between step 652 and 660 is dashed to represent that step 660 may be performed at a different time than step 650 and 652 and/or in a manner unrelated to steps 651 and 652.

Figure 13:
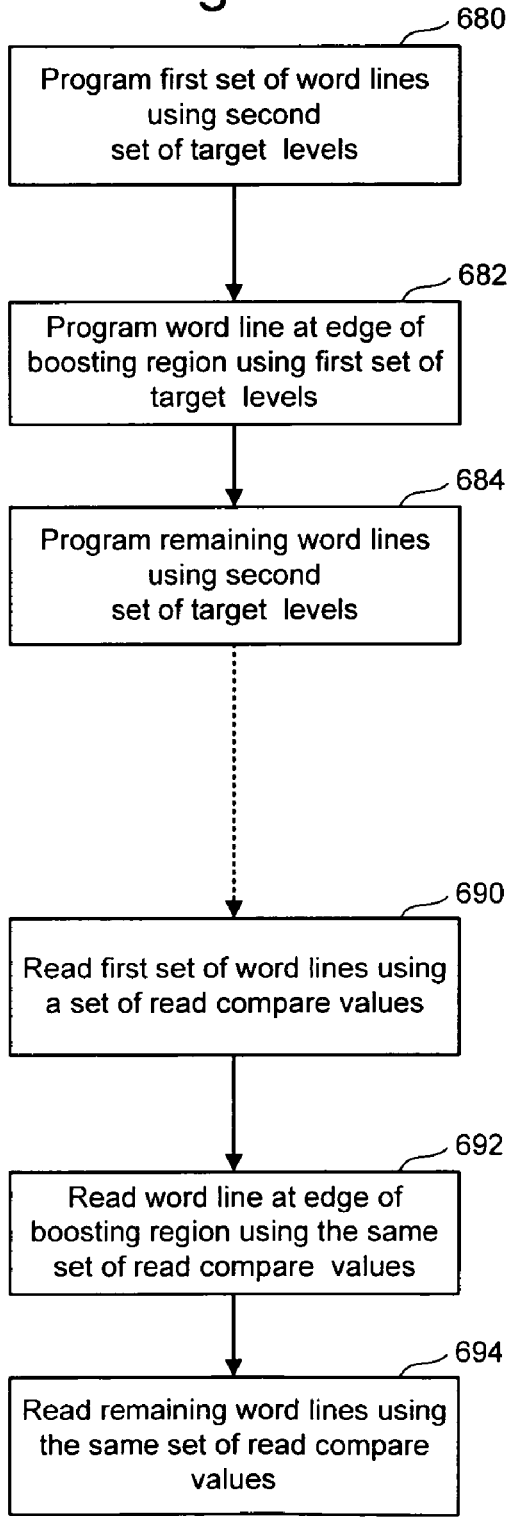
FIG. 13 is a flow chart describing one embodiment of a process for programming and reading non-volatile memory.

FIG. 13 provides a flow chart explaining an embodiment of a process that uses one set of target levels for a word line at the edge of a boosting region and another set of target levels for the other word lines. In the process of FIG. 11 described above, WL0 is at the edge of the boosting region. However, in other embodiments the edge of a boosting region can be located elsewhere. In step 680 of FIG. 13, memory cells connected to a first set of word lines are programmed using the second set of target levels to verify whether the respective memory cells have completed programming. In step 682, memory cells connected to the word line at the edge of the boosting region are programmed using the first set of target levels to verify whether the respective memory cells have completed programming. In step 684, memory cells connected to the remaining word lines are programmed using the second set of target levels to verify whether the respective memory cells have completed programming. In other embodiments, additional sets of word lines and additional edge word lines can be included.

In step 690, memory cells connected to the first set of word lines are read using a set of read compare values (e.g. Vra, Vrb and Vrc). In step 692, memory cells connected to the word line at the edge of the boosting region during programming are read using the same set of read compare values as used in step 692. In step 694, memory cells connected to the remaining set of word lines are read using the same set of read compare values as used in step 692. Note that the arrow between step 684 and 690 is dashed to represent that step 690 may performed at a different time than step 684 and/or in a manner unrelated to step 684.

Figure 14:
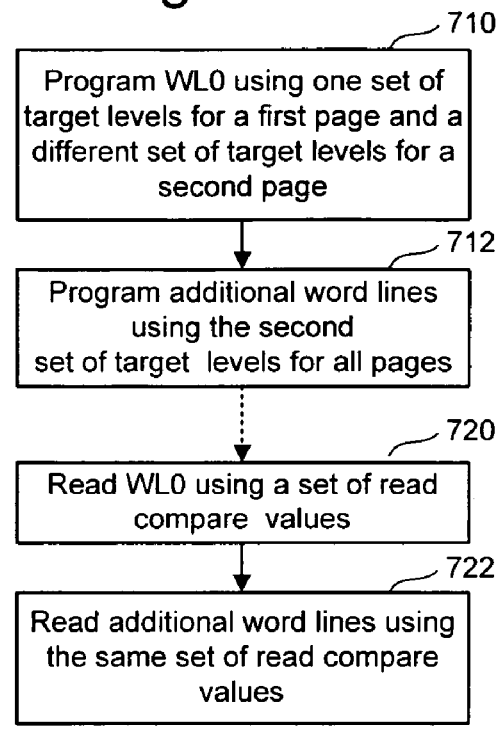
FIG. 14 is a flow chart describing one embodiment of a process for programming and reading non-volatile memory.

FIG. 14 provides a flow chart explaining an embodiment of a process that uses different sets of target levels for different pages of data associated with a word line at the edge of a boosting region (e.g., next to source select line) and another set of target levels for the other word lines. In step 710, memory cells connected to word line WL0 (or another word line) are programmed using the first set of target levels (Vva1, Vvb1, Vvc1) for a first page of data and a different set of target levels for a second page of data. For example, the different set of target levels can include target levels Vva3, Vvb3, Vvc3, where:

(1) Vva3≠Vva1, Vvb3≠Vvb1, Vvc3≠Vvc1; and
(2) Vva3<Vva2, Vvb3<Vvb2, Vvc3<Vvc2.

In other embodiments, the different set of target levels can include some of the target levels Vva3, Vva3 and Vvb3, with the remaining target levels being the same as the first set of target levels or the second set of target levels.

In step 712, the memory cells connected to additional word lines other than WL0 are programmed using the second set of target levels, as described above.

In step 720, all or a subset of the memory cells connected to the word line WL0 are read using a set of read compare values (e.g. Vra, Vrb and Vrc). In step 722, all or a subset of the memory cells connected to the word lines other than the word line WL0 are read using the same set of read compare values as used in step 720. Note that the arrow between step 712 and 720 is dashed to represent that step 720 may performed at a different time than step 712 and 710 and/or in a manner unrelated to steps 712 and 710.

Figure 15:
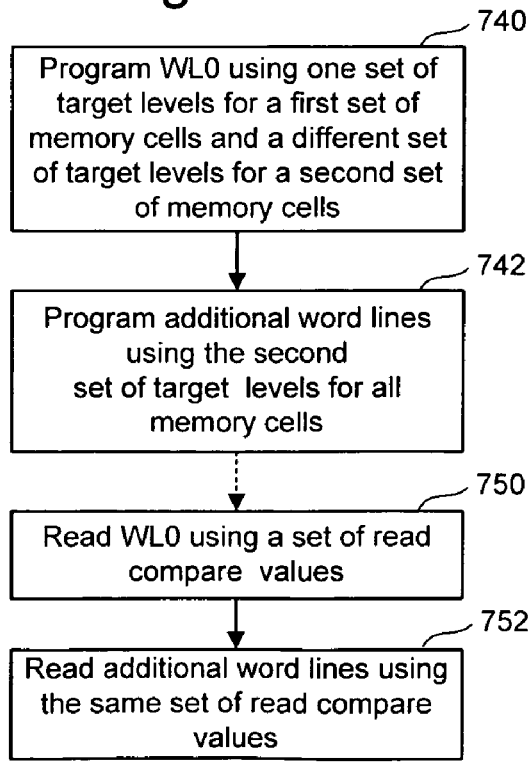
FIG. 15 is a flow chart describing one embodiment of a process for programming and reading non-volatile memory.

FIG. 15 provides a flow chart explaining an embodiment of a process that uses different sets of target levels for different planes (or section or groups) of memory cells connected to a word line at the edge of a boosting region (e.g., next to the source select line, such as WL0) and another set of target levels for the other word lines. In step 740, memory cells connected to word line WL0 (or a different word line) are programmed using the first set of target levels for a first grouping of memory cells and the different set of target levels for a second grouping of memory cells. In step 742, the memory cells connected to additional word lines other than WL0 are programmed using the second set of target levels.

For example, looking back at FIG. 8, the first plane or grouping can include memory cells on NAND strings connected to bit lines Ble0-Ble2127 and the second plane or grouping can include memory cells on NAND strings connected to bit lines Ble2128-Ble4255. In another embodiment, the first plane or grouping can include memory cells on NAND strings connected to bit lines Blo0-Blo2127 and the second plane or grouping can include memory cells on NAND strings connected to bit lines Blo2128-Blo4255. Another alternative is for the first plane or grouping to include memory cells on NAND strings connected to bit lines 0 through (½(x)−1) and the second plane or grouping can include memory cells on NAND strings connected to bit lines ½(x) through (x−1), where x is the total number of bit lines for user data. Another alternative is for the first plane or grouping to include memory cells on NAND strings connected to odd bit lines and the second plane or grouping can include memory cells on NAND strings connected to even bit lines. Other groupings can also be used, and more than two groupings can be used.

In step 750, all or a subset of the memory cells connected to the word line WL0 (or another word line) are read using a set of read compare values (e.g. Vra, Vrb and Vrc). In step 752, all or a subset of the memory cells connected to the word lines other than word line WL0 are read using the same set of read compare values as used in step 750. Note that the arrow between step 742 and 750 is dashed to represent that step 750 may be performed at a different time than steps 740 and 742 and/or in a manner unrelated to steps 740 and 742.

Figure 16:
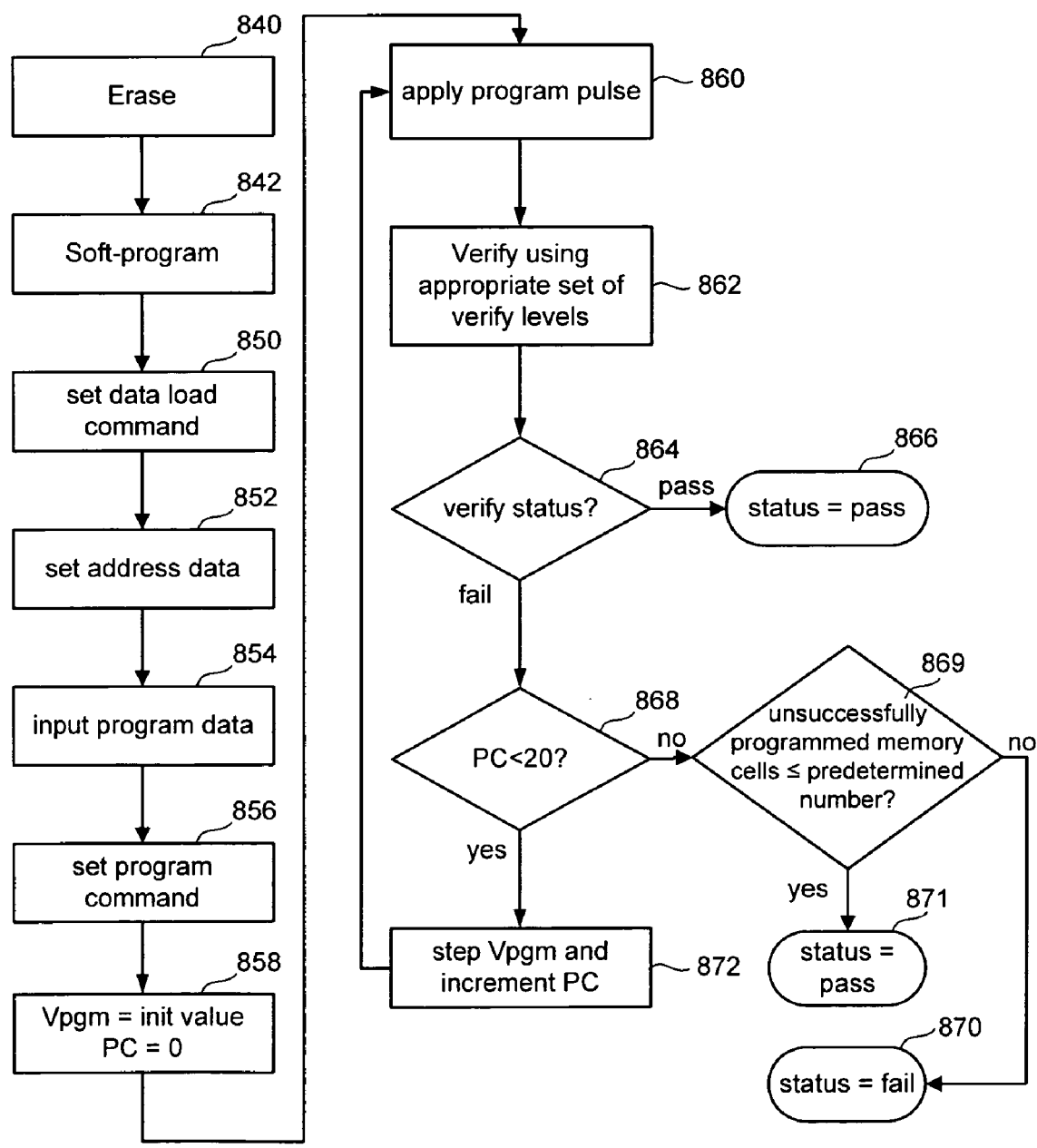
FIG. 16 is a flow chart describing one embodiment of a programming operation.

FIG. 16 is a flow chart describing one embodiment of a programming operation. The process of FIG. 16 can be used to program the memory cells connected to a word line using full sequence programming. In embodiments that program different pages at different times, the process of FIG. 16 can be used to program one page or one pass for a particular word line or set of memory cells. Because a programming process may include programming multiple pages and memory cells connected to multiple word lines, a programming process may include performing the programming operation of FIG. 16 multiple times.

The memory cells to be programmed are erased at step 840. Step 840 can include erasing more memory cells than those to be programmed (e.g., in blocks or other units). At step 842, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 850 of FIG. 16, a "data load" command is issued by controller 518 and input to command circuits 514, allowing data to be input to data input/output buffer 512. The input data is recognized as a command and latched by state machine 516 via a command latch signal, not illustrated, input to command circuits 514. At step 852, address data designating the page address is input to row controller or decoder 506 from the controller or host. The input data is recognized as the page address and latched via state machine 516, affected by the address latch signal input to command circuits 514. At step 854, a page of program data for the addressed page is input to data input/output buffer 512 for programming. For example, 582 bytes of data could be input in one embodiment. That data is latched in the appropriate registers for the selected bit lines. In some embodiments, the data is also latched in a second register for the selected bit lines to be used for verify operations. At step 856, a "program" command is issued by controller 518 and input to data input/output buffer 512. The command is latched by state machine 516 via the command latch signal input to command circuits 514.

Triggered by the "program" command, the data latched in step 854 will be programmed into the selected memory cells controlled by state machine 516 using the stepped pulses applied to the appropriate word line. At step 858, Vpgm, the programming voltage pulse applied to the selected word line, is initialized to the starting magnitude (e.g., ~12V or another suitable level) and a program counter PC maintained by state machine 516 is initialized at 0. At step 860, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming. As depicted in FIGS. 4 and 5, the unselected word lines receive Vpass, the drain select signal is set at Vsgd and the source select signal is set at 0v. The source line is set at or near zero volts.

At step 862, the states of the selected memory cells are verified using the appropriate set of target levels, as discussed above with respect to FIGS. 11, 13, 14 and 15. If it is detected that the threshold voltage of a selected cell has reached the appropriate target level, then the data stored in the corresponding data latch is changed to a logic "1." If it is detected that the threshold voltage has not reached the appropriate target level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 864, it is checked whether all of the data latches are storing logic "1." If so, the programming process is complete and successful because all selected memory cells were programmed and verified to their target states. A status of "PASS" is reported at step 866. Note that in some implementations, at step 864 it is checked whether at least a predetermined number of data latches are storing a logic "1". This predetermined number can be less than the number of all data latches. Thus allowing the programming process to stop before all memory cells have reached their appropriate verify levels. The memory cells that are not successfully programmed can be corrected using error correction during the read process.

If, at step 864, it is determined that not all of the data latches are storing logic "1," then the programming process continues. At step 868, the program counter PC is checked against a program limit value. One example of a program limit value is 20; however, other values can be used in various implementations. If the program counter PC is not less than 20, then it is determined at step 869 whether the number of memory cells that have not been successfully programmed is equal to or less than a predetermined number. If the number of unsuccessfully programmed memory cells is equal to or less than the predetermined number, then the programming process is flagged as passed and a status of PASS is reported at step 871. In many cases, the memory cells that are not successfully programmed can be corrected using error correction during the read process. If however, the number of unsuccessfully programmed memory cells is greater than the predetermined number, the program process is flagged as failed and a status of FAIL is reported at step 870. If the program counter PC is less than 20, then the Vpgm level is increased by the step size (e.g., 0.2-0.4 volt step size) and the program counter PC is incremented at step 872. After step 872, the process loops back to step 860 to apply the next Vpgm pulse.

Figure 17:
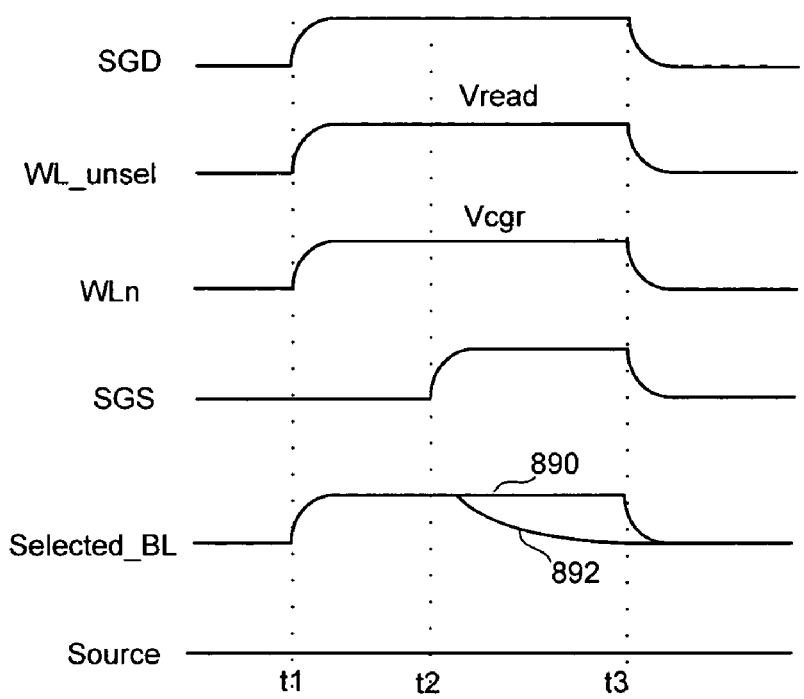
FIG. 17 is a signal diagram depicting one embodiment of a read operation.

FIG. 17 is a timing diagram depicting the behavior of various signals during one iteration of a read or verify operation. For example, if the memory cells are binary memory cells, the process of FIG. 17 may be performed in parallel for each memory cell during a read or verify process. If the memory cells are multi-state memory cells with four states (e.g., E, A, B, and C), the process of FIG. 17 may be performed three times for each memory cell in parallel during a read or verify process. For example, when reading data from a memory cell with four states, the read process may be performed once with Vcgr=Vra, once with Vcgr=Vrb and once with Vcgr=Vrc, or other sets of read values. When verifying data for a memory cell with four states, the read process may be performed once with Vcgr=Vva2, once with Vcgr=Vvb2 and once with Vcgr=Vvc2, or other sets of verify levels.

In general, during the read and verify operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges a dedicated capacitor in the sense amplifier. In one embodiment, a memory array that uses all bit line programming can measure the conduction current of a memory cell by the rate it discharges a dedicated capacitor in the sense amplifier. In another example, the conduction current of the selected memory cell allows (or fails to allow) the NAND string that includes the memory cell to discharge the bit line. The charge on the bit line is measured after a period of time to see whether it has been discharged or not. In one embodiment, a memory array that uses odd/even programming can measure the conduction current of a memory cell by determining whether the bit line has discharged.

FIG. 17 shows signals SGD, WL_unsel. WLn, SGS, Selected BL, and Source starting at Vss (approximately 0 volts). SGD represents the signal on the drain select line connected to the gate of the drain select gate. SGS represents the signal on the source select line connected to the gate of the source select gate. WLn is the word line selected for reading/verification. WL_unsel represents the unselected word lines. Selected_BL is the bit line selected for reading/verification. Source is the source line for the memory cells.

FIG. 17 describes the behavior of a system that measures the conduction current of a memory cell by determining whether the bit line has appropriately discharged. At time t1 of FIG. 10, SGD is raised to Vdd (e.g., approximately 3.5 volts) or another voltage, typically in the 3-5V range, the unselected word lines (WL_unsel) are raised to Vread (e.g., approximately 5.5 volts), the selected word line WLn is raised to Vcgr, and the selected bit line Selected BL is precharged to approximately 0.7 volts. The voltage Vread acts as pass a voltage because it causes the unselected memory cells to turn on and act as pass gates. At time t2, the source select gate is turned on by raising SGS to Vdd. This provides a path to reduce the charge on the bit line. If the threshold voltage of the memory cell selected for reading is greater than Vcgr, then the selected memory cell will not turn on (or at least will not turn on sufficiently) and the bit line will not discharge (or at least will not discharge sufficiently), as depicted by signal line 890. If the threshold voltage in the memory cell selected for reading is below Vcgr, then the memory cell selected for reading will turn on (conduct) and the bit line voltage will reduce, as depicted by curve 892. At some point after time t2 and prior to time t3 (as determined by the particular implementation), the appropriate sense amplifier will determine whether the bit line voltage has reduced a sufficient amount. At time t3, the depicted signals will be lowered to Vss (or another value for standby or recovery). Note that in other embodiments, the timing of some of the signals can be changed.

Figure 18:
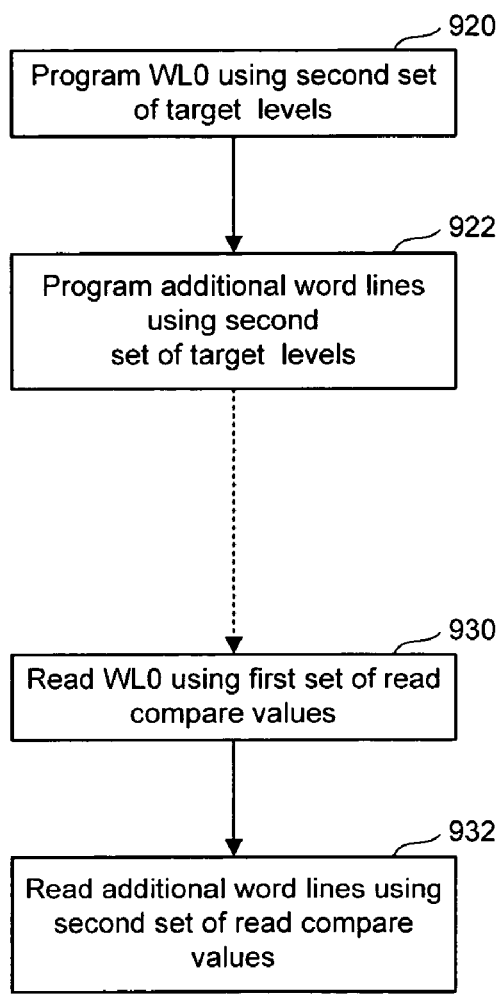
FIG. 18 is a flow chart describing one embodiment of a process for programming and reading non-volatile memory.

Rather than (or in addition to) reducing the impact of program disturb by changing the target levels for verification, different read compare values can be used for a particular word line (or other grouping of storage elements) during a read process. For example, FIG. 18 describes one embodiment of a process for operating non-volatile storage that includes using different read compare values for one or more particular word lines. In step 920, the memory cells connected to WL0 are programmed using the second set of target levels mentioned above. In step 922, the memory cells connected to the additional word lines are programmed using the second set of target levels mentioned above. In step 930, the memory cells connected to WL0 are read using a first set of read compare values. That is, the second set of read compare values are applied to the appropriate control gates via the appropriate word lines. In step 932, the memory cells connected to the additional word lines are read using a second set of read compare values. Note that the arrow between step 922 and 930 is dashed to represent that step 930 may performed at a different time than step 922 and 920 and/or in a manner unrelated to steps 922 and 920.

In another embodiment, steps 920 and 930 can be applied to multiple word lines (e.g., WL0 and WL1, WL0-2, or other groupings including groupings that do not include WL0 but may be at an edge, as explained below). That is, there could be two groups of word lines. The first group of word lines would be read using the first set of read compare values and the second group of word lines would be read with the second set of read compare values.

Figure 19:
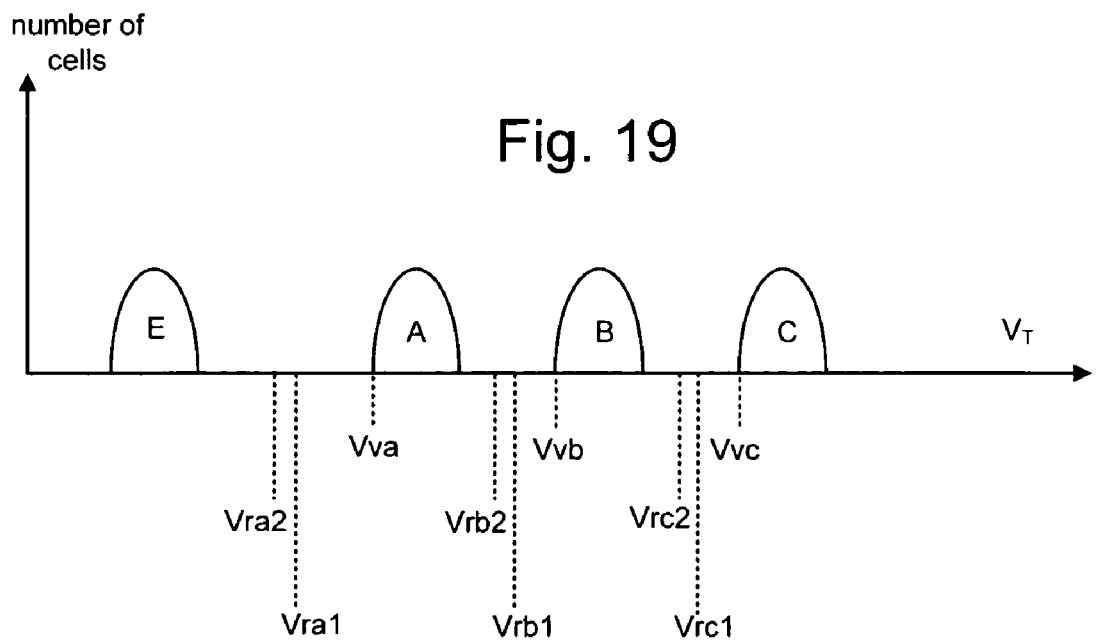
FIG. 19 depicts a set of threshold voltage distributions.

FIG. 19 shows an example set of threshold voltage distributions that are similar to the distribution depicted in FIG. 9. FIG. 19 depicts two read compare values for each state. Read compare values Vra1 and Vra2 are associated with state A. Read compare values Vrb1 and Vrb2 are associated with state B. Read compare values Vrc1 and Vrc2 are associated with state C. In one embodiment, the first set of read compare values includes Vra1, Vrb1 and Vrc1; the second set of read compare values includes Vra2, Vrb2 and Vrc2; and Vra1>Vra2, Vrb1>Vrb2 and Vrc1>Vrc2. Thus, when performing step 930, the process of FIG. 17 is performed once for WL0 with Vcgr=Vra1, once for WL0 with Vcgr=Vrb1, and once for WL0 with Vcgr=Vrc1. When performing step 932, the process of FIG. 17 is performed once for each of the subject word lines with Vcgr=Vra2, once for each of the subject word lines with Vcgr=Vrb2, and once for each of the subject word lines with Vcgr=Vrc2. In other embodiments, the first set of read compare values could include Vra1, Vrb1 and Vrc2; or the first set of read compare values could include Vra1, Vrb2 and Vrc2. Other permutations can also be implemented.

In another embodiment of step 930, the first set of read compare values is used to read a first subset of memory cells connected to word line WL0 and a third set of read compare values is used to read a second subset of memory cells connected to word line WL0. The two subsets can be memory cells in different planes or groupings as described above. In one implementation, the two subsets are disjoint, for example, odd and even bit lines; or the first plane or grouping includes memory cells on NAND strings connected to bit lines 0 through (½(x)−1) and the second plane or grouping can includes memory cells on NAND strings connected to bit lines ½(x) through (x−1), where x is the total number of bit lines for user data. Other groupings can also be used. Note that the third set of read compare values is different (partially or completely) than the second set of read compare values.

In another embodiment of step 930, the first set of read compare values is used to read data for a first page of data stored in the memory cells connected to word line WL0 and a third set of read compare values is used to read data for a second page of data stored in the memory cells connected to word line WL0. The third set of read compare values is different (partially or completely) than the second set of read compare values.

Figure 20:
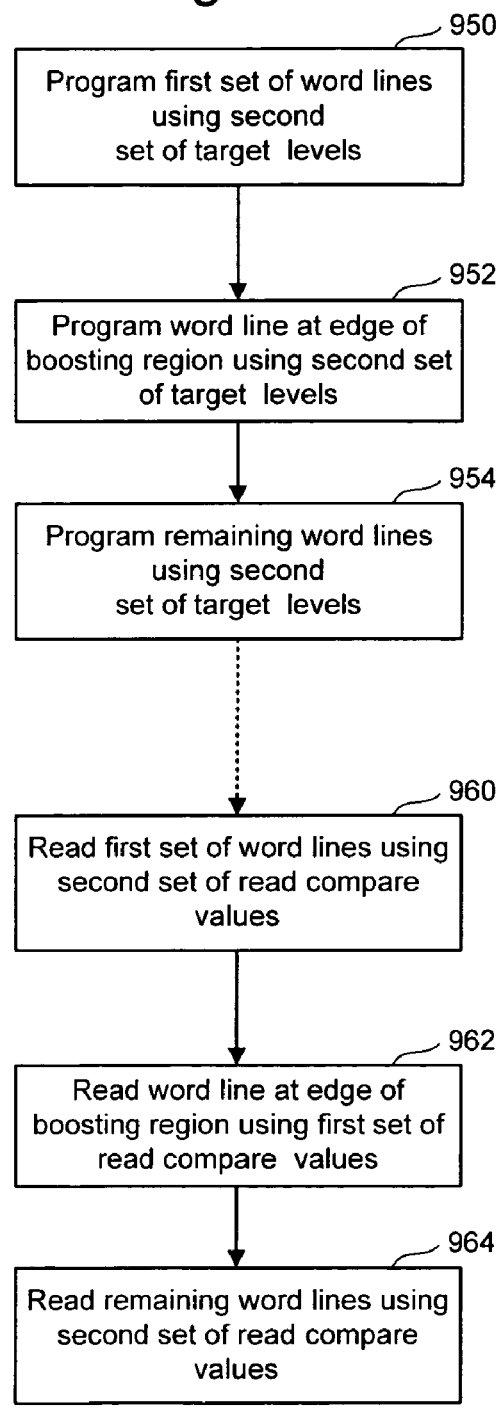
FIG. 20 is a flow chart describing one embodiment of a process for programming and reading non-volatile memory.

FIG. 20 describes another embodiment of a process for operating non-volatile storage that includes using different read compare values for a particular word line. In step 950, the memory cells connected to a first set of word lines are programmed using the second set of target levels mentioned above. In step 952, the memory cells connected to a word line at the edge of a boosting region are programmed using the second set of target levels mentioned above. In step 954, the memory cells connected to the remaining word lines are programmed using the second set of target levels mentioned above. Note that the word line at the edge of the boosting region is not part of the first set of word lines and the remaining word lines.

During steps 950, 952 and 954 of FIG. 20, the programming operations include providing a 0 volt signal (or other appropriate signal) on a word line or select line to turn off the corresponding transistors in order to create the boosting region. One example includes applying 0 volts to the source select line SGS so that the source select gate turns off, which cuts off the channel from the source line and help cause the boosting of the NAND string. In some embodiments, a word line connected to the NAND string can receive a 0 volt signal (or other appropriate signal) to cut off the memory cells connected to that word line so that the boosting region ends or starts at that word line. This can also be used to create multiple boosting regions.

In step 960, the memory cells connected to the first set of word lines are read using the second set of read compare values mentioned above. In step 962, the memory cells connected to the word line at the edge of the boosting region are read using the first set of read compare values mentioned above. In step 964, the memory cells connected to the remaining word lines are read using the second set of read compare values. Note that the arrow between step 954 and 960 is dashed to represent that step 960 may performed at a different time than step 954 and/or in a manner unrelated to step 964.

In some embodiments of step 962, different sets of read compare values can be used to read different pages of data associated with the word line at the edge of the boosting region. Different sets of read compare values can be used to read planes or groupings of memory cells connected to the word line at the edge of the boosting region. In both alternatives, the different sets of read compare values are also different (partially or completely) from the second set of read compare values.

Although the above discussion focuses on reducing the impact of program disturb on particular word lines, the current invention can also be used to reduce the impact of word lines that have wider Vt distributions for any other reason. One other reason for the occurrence of wider Vt distributions on some word lines can be so-called over-programming due to, for example, fast programming memory cells being concentrated on one or a limited number of word lines. Over-programming also results in similar Vt distributions as depicted in FIG. 12. By applying different verify target levels or read compare values to such word lines, the impact of the Vt distribution widening on those word lines can be reduced as well.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A non-volatile storage system, comprising:
   non-volatile storage elements, said non-volatile storage elements include a first set of non-volatile storage elements and a second set of non-volatile storage elements; and
   a managing circuit in communication with said first set of non-volatile storage elements and said second set of non-volatile storage elements, said managing circuit performs a programming process that includes programming said first set of non-volatile storage elements using a first set of target levels and programming said second set of non-volatile storage elements using a second set of target levels so that threshold voltage distributions of said first set of non-volatile storage elements are within corresponding threshold voltage distributions of said second set of non-volatile storage elements upon completion of said programming process, at least one of said first set of target levels is different than a corresponding target level of said second set of target levels.

2. A non-volatile storage system according to claim 1, wherein:
   said first set of one or more non-volatile storage elements and said second set of one or more non-volatile storage elements are multi-state NAND flash memory devices.

3. A non-volatile storage system according to claim 1, wherein:
   said non-volatile storage elements are arranged in blocks, each block includes a set of pages, said pages define units of programming and blocks define units of erase;
   said first set of non-volatile storage elements are connected to a first word line of a particular block;
   said particular block includes a set of bit lines; and
   each of said first set of non-volatile storage elements are connected to a different bit line of said set of bit lines.

4. A non-volatile storage system according to claim 1, wherein:
   said one of said first set of target levels is lower than said corresponding target level of said second set of target levels.

5. A non-volatile storage system according to claim 1, wherein:
   all of said first set of target levels are below corresponding target levels of said second set of target levels.

6. A non-volatile storage system according to claim 1, wherein:
   said managing circuit includes any one or a combination of a controller, a state machine, command circuits, control circuits and decoders.

7. A non-volatile storage system according to claim 1, wherein:
   said first set of non-volatile storage elements are connected to a word line that is next to a source select line.

8. A non-volatile storage system according to claim 1, wherein:
   said first set of non-volatile storage elements are connected to a first word line;

said second set of non-volatile storage elements are connected to word lines other than said first line; and said first set of non-volatile storage elements are programmed prior to said second set of non-volatile storage elements.

9. A non-volatile storage system according to claim 1, wherein:
  said first set of non-volatile storage elements are connected to a first word line;
  said second set of non-volatile storage elements are connected to word lines other than said first line;
  a different set of non-volatile storage elements are connected to said first word line;
  said managing circuit programs said different set of non-volatile storage elements using a different set of target levels so that threshold voltage distributions of said different set of non-volatile storage elements are within corresponding threshold voltage distributions of said second set of non-volatile storage elements upon completion of said programming process, at least one of said different set of target levels is below a corresponding target level of said second set of target levels.

10. A non-volatile storage system according to claim 1, wherein:
  said managing circuit programs said first set of non-volatile storage elements using said first set of target levels for a first page of data and using a different set of target levels for a second page of data.

11. A non-volatile storage system according to claim 1, wherein:
  said managing circuit reads said first set of non-volatile storage elements using a first set of read compare values and reads said second set of non-volatile storage elements using said first set of read compare values.

* * * * *